(12) United States Patent
Kim et al.

(10) Patent No.: US 11,101,840 B1
(45) Date of Patent: Aug. 24, 2021

(54) CHIP RADIO FREQUENCY PACKAGE AND RADIO FREQUENCY MODULE

(71) Applicant: Samsung Electro-Mechanics Co., Ltd., Suwon-si (KR)

(72) Inventors: Hak Gu Kim, Suwon-si (KR); Ho Kyung Kang, Suwon-si (KR); Seong Jong Cheon, Suwon-si (KR); Young Sik Hur, Suwon-si (KR); Jin Seon Park, Suwon-si (KR); Yong Duk Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/994,955

(22) Filed: Aug. 17, 2020

Related U.S. Application Data

(63) Continuation-in-part of application No. 16/891,265, filed on Jun. 3, 2020.

(30) Foreign Application Priority Data

Feb. 5, 2020 (KR) .......................... 10-2020-0013914
Jul. 17, 2020 (KR) .......................... 10-2020-0088717

(51) Int. Cl.
| | | |
|---|---|---|
| *H01L 25/16* | (2006.01) | |
| *H01L 21/56* | (2006.01) | |
| *H01L 23/495* | (2006.01) | |
| *H01L 23/488* | (2006.01) | |
| *H05K 1/18* | (2006.01) | |

(Continued)

(52) U.S. Cl.
CPC ........... *H04B 1/40* (2013.01); *H01L 23/5383* (2013.01); *H01L 23/5384* (2013.01); *H01L 23/66* (2013.01); *H01L 25/0652* (2013.01); *H01Q 1/2283* (2013.01); *H01Q 9/0407* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 5,596,226 A | 1/1997 | Beilstein, Jr. et al. | |
| 7,141,884 B2 * | 11/2006 | Kojima | ............... H01L 23/3121 257/778 |

(Continued)

FOREIGN PATENT DOCUMENTS

JP          3137565 B2    2/2001

*Primary Examiner* — Tuan A Tran
(74) *Attorney, Agent, or Firm* — NSIP Law

(57) ABSTRACT

A chip radio frequency package includes a substrate including a first cavity, first and second connection members, a core member, a radio frequency integrated circuit (RFIC) disposed on an upper surface of the substrate, and a first front-end integrated circuit (FEIC) disposed in the first cavity. The core member includes a core insulating layer and a core via that penetrates the core insulating layer. The first connection member has a structure in which a first insulating layer and a first wiring layer are stacked. The second connection member has a second structure in which a second insulating layer and a second wiring layer are stacked. The RFIC inputs or outputs a base signal and a first radio frequency (RF) signal having a frequency higher than a frequency of the base signal, and the first FEIC inputs or outputs the first RF signal and a second RF signal.

17 Claims, 23 Drawing Sheets

(51) Int. Cl.
   *H04B 1/40*       (2015.01)
   *H01Q 9/04*       (2006.01)
   *H01Q 1/22*       (2006.01)
   *H01L 25/065*     (2006.01)
   *H01L 23/538*     (2006.01)
   *H01L 23/66*      (2006.01)

(56) References Cited

U.S. PATENT DOCUMENTS

| | | | | |
|---|---|---|---|---|
| 7,279,771 B2* | 10/2007 | Sunohara | | H01L 23/50 |
| | | | | 257/516 |
| 7,321,164 B2* | 1/2008 | Hsu | | H01L 23/5389 |
| | | | | 257/685 |
| 7,982,297 B1* | 7/2011 | Heo | | H01L 23/3128 |
| | | | | 257/686 |
| 8,132,320 B2* | 3/2012 | Wang | | H01L 23/13 |
| | | | | 29/846 |
| 8,502,370 B2* | 8/2013 | Chan | | H01L 23/49811 |
| | | | | 257/686 |
| 8,624,369 B2* | 1/2014 | Nam | | H03H 9/0547 |
| | | | | 257/678 |
| 8,674,236 B2* | 3/2014 | Higo | | H01L 23/49822 |
| | | | | 174/262 |
| 8,766,440 B2* | 7/2014 | Kikuchi | | H01L 24/20 |
| | | | | 257/738 |
| 9,049,791 B2* | 6/2015 | Hurwitz | | H05K 1/115 |
| 9,161,461 B2* | 10/2015 | Hurwitz | | H01L 23/3677 |
| 9,252,031 B2* | 2/2016 | Im | | H01L 23/49811 |
| 9,559,041 B2* | 1/2017 | Ishihara | | H01L 24/13 |
| 9,627,309 B2* | 4/2017 | Kobayashi | | H01L 23/5385 |
| 9,748,217 B2* | 8/2017 | Ohba | | H01L 23/481 |
| 9,852,970 B2* | 12/2017 | Kobayashi | | H01L 23/49822 |
| 9,859,201 B2* | 1/2018 | Shimizu | | H05K 1/0346 |
| 10,325,841 B2* | 6/2019 | Nakagawa | | H01L 23/49827 |
| 10,340,232 B2* | 7/2019 | Aoki | | H01L 23/645 |
| 10,453,804 B2 | 10/2019 | Kamgaing et al. | | |
| 2004/0075616 A1 | 4/2004 | Endo et al. | | |
| 2008/0136002 A1 | 6/2008 | Yang | | |
| 2009/0051024 A1* | 2/2009 | Chia | | H01L 24/20 |
| | | | | 257/686 |
| 2009/0250801 A1* | 10/2009 | Isa | | H01G 4/35 |
| | | | | 257/686 |
| 2012/0205142 A1* | 8/2012 | Higo | | H05K 1/0242 |
| | | | | 174/251 |
| 2013/0147041 A1* | 6/2013 | Chan | | H01L 25/105 |
| | | | | 257/738 |
| 2015/0022985 A1* | 1/2015 | Na | | H01L 23/50 |
| | | | | 361/763 |
| 2016/0081194 A1* | 3/2016 | Sato | | H05K 3/4697 |
| | | | | 361/761 |
| 2016/0322294 A1* | 11/2016 | Kobayashi | | H01L 23/49822 |
| 2019/0019758 A1* | 1/2019 | Kim | | H01L 21/563 |

* cited by examiner

CHIP RADIO FREQUENCY PACKAGE AND RADIO FREQUENCY MODULE

CROSS REFERENCE TO RELATED APPLICATIONS

This application is a continuation-in-part of U.S. application Ser. No. 16/891,265, filed on Jun. 3, 2020, which claims the benefit under 35 USC § 119(a) of Korean Patent Application Nos. 10-2020-0013914 filed on Feb. 5, 2020 and 10-2020-0088717 filed on Jul. 17, 2020, in the Korean Intellectual Property Office, the entire disclosure of which is incorporated herein by reference for all purposes.

BACKGROUND

1. Field

The following description relates to a chip radio frequency package and a radio frequency module.

2. Description of Related Art

Data traffic in mobile communications systems continues to rapidly increase each year. Systems that support the transmission of such rapidly increased data in real time in wireless networks are being implemented. For example, the contents of systems such as internet of things (IoT) based data, augmented reality (AR), virtual reality (VR), live VR/AR combined with SNS, autonomous navigation, applications such as Sync View (real-time video user transmissions using ultra-small cameras), and the like may benefit from communications (e.g., 5G communications, mmWave communications, etc.) that support the transmission and reception of large amounts of data.

Additionally, millimeter wave (mmWave) communications, including 5th generation (5G) communications, are being implemented in communications systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a radio frequency module includes a first substrate including first and second connection members, and including a core member disposed between the first and second connection members and having a first cavity; a radio frequency IC (RFIC) disposed on an upper surface of the first substrate; a first front end IC (FEIC) disposed in the first cavity; and a second substrate providing a dispositional region of the first substrate, wherein the core member comprises a core insulating layer, and a core via disposed to penetrate through the core insulating layer, the first connection member has a first stacked structure in which at least one first insulating layer and at least one first wiring layer are alternately stacked, is electrically connected to the core via, and disposed on a lower surface of the core member, the second connection member has a second stacked structure in which at least one second insulating layer and at least one second wiring layer are alternately stacked, is electrically connected to the core via, and disposed on an upper surface of the core member, the RFIC inputs or outputs a base signal and a first radio frequency (RF) signal having a frequency, higher than the frequency of the base signal, through the at least one second wiring layer, and the first RFIC inputs or outputs the first RF signal and a second RF signal having power, different from that of the first RF signal.

The radio frequency module may include an electrical connection structure electrically connected between the second substrate and the first substrate, wherein the first substrate is disposed on an upper surface of the second substrate.

The second substrate may include a patch antenna pattern configured to transmit or receive the second RF signal, and a feed via configured to be fed to the patch antenna pattern.

The radio frequency module may include a chip antenna disposed on the second substrate and configured to transmit or receive the second RF signal, and having a higher dielectric constant than the dielectric constant of the second substrate, wherein the second substrate comprises a feed via configured to be fed to the chip antenna.

The radio frequency module may include a second FEIC disposed in a second cavity of the core member.

The second substrate may include at least four patch antenna patterns configured to transmit or receive the second RF signal; and at least four feed vias configured to be fed to a corresponding patch antenna pattern among the at least four patch antenna patterns, respectively, wherein at least two of the at least four feed vias are electrically connected to the first FEIC, and a remainder thereof are electrically connected to the seconds FEIC.

The radio frequency module may include at least four chip antennas disposed on the second substrate, and configured to transmit or receive the second RF signal and having a higher dielectric constant than the dielectric constant of the second substrate; and at least four feed vias configured to be fed to a corresponding chip antenna among the at least four chip antennas, respectively, wherein at least two of the at least four feed vias are electrically connected to the first FEIC, and a remainder thereof are electrically connected to the second FEIC.

The radio frequency module may include an encapsulant sealing at least a portion of the RFIC on the upper surface of the first substrate.

The lower surface of the first substrate may be smaller than the upper surface of the second substrate.

The first substrate may be comprised of a plurality of first substrates, spaced apart from each other, the first FEIC is disposed on one of the plurality of first substrates, the radio frequency module further comprises a second FEIC disposed on the other one of the plurality of first substrates, the second substrate is comprised of a plurality of second substrates, spaced apart from each other, and each of the plurality of second substrates provides at least one of a first dispositional region of the patch antenna pattern configured to transmit or receive the second RF signal and a second dispositional region of the chip antenna configured to transmit or receive the second RF signal and having a higher dielectric constant than the dielectric constant of the second substrate.

The plurality of second substrates may be comprised of at least three second substrates, spaced apart from each other, and at least one of the at least three second substrates is spaced apart from the plurality of first substrates.

In a general aspect, a radio frequency module includes a first substrate including first and second connection members, and including a core member disposed between the first and second connection members and having a first cavity; a first front end IC (FEIC) disposed in the first cavity; a radio frequency IC (RFIC) electrically connected to the first FEIC;

a base substrate providing a dispositional region of the first substrate; and a plurality of antenna modules disposed on the base substrate, spaced apart from each other and electrically connected to the first FEIC, and configured to transmit or receive a second radio frequency (RF) signal, respectively, wherein the core member comprises a core insulating layer and a core via disposed to penetrate through the core insulating layer, the first connection member has a first stacked structure in which at least one first insulating layer and at least one first wiring layer are alternately stacked, is electrically connected to the core via, and disposed on a lower surface of the core member, the second connection member has a second stacked structure in which at least one second insulating layer and at least one second wiring layer are alternately stacked, is electrically connected to the core via, and disposed on an upper surface of the core member, the RFIC inputs or outputs a base signal and a first RF signal having a higher frequency than the frequency of the base signal, and the first FEIC inputs or outputs the first RF signal and the second RF signal having power, different from the power of the first RF signal.

At least one of the plurality of antenna modules may include a second substrate including a plurality of feed vias electrically connected to the base substrate, and a plurality of patch antenna patterns fed from a corresponding feed via of the plurality of feed vias.

At least one of the plurality of antenna modules may include a second substrate including a plurality of feed vias electrically connected to the base substrate, and a plurality of chip antennas disposed on the second substrate, and configured to transmit or receive the second RF signal and having a higher dielectric constant than the dielectric constant of the second substrate.

The radio frequency module may include a second FEIC disposed in a second cavity of the core member, wherein the plurality of antenna modules comprise at least three antenna modules, and at least one of the first and second FEICs is electrically connected to at least two of the at least three antenna modules.

The plurality of antenna modules may be disposed to transmit or receive the second RF signal in different directions from each other.

The plurality of antenna modules may include a communication modem disposed on the base substrate, wherein the base substrate provides a dispositional region of the RFIC.

Other features and aspects will be apparent from the following detailed description, the drawings, and the claims.

Figure 1A:
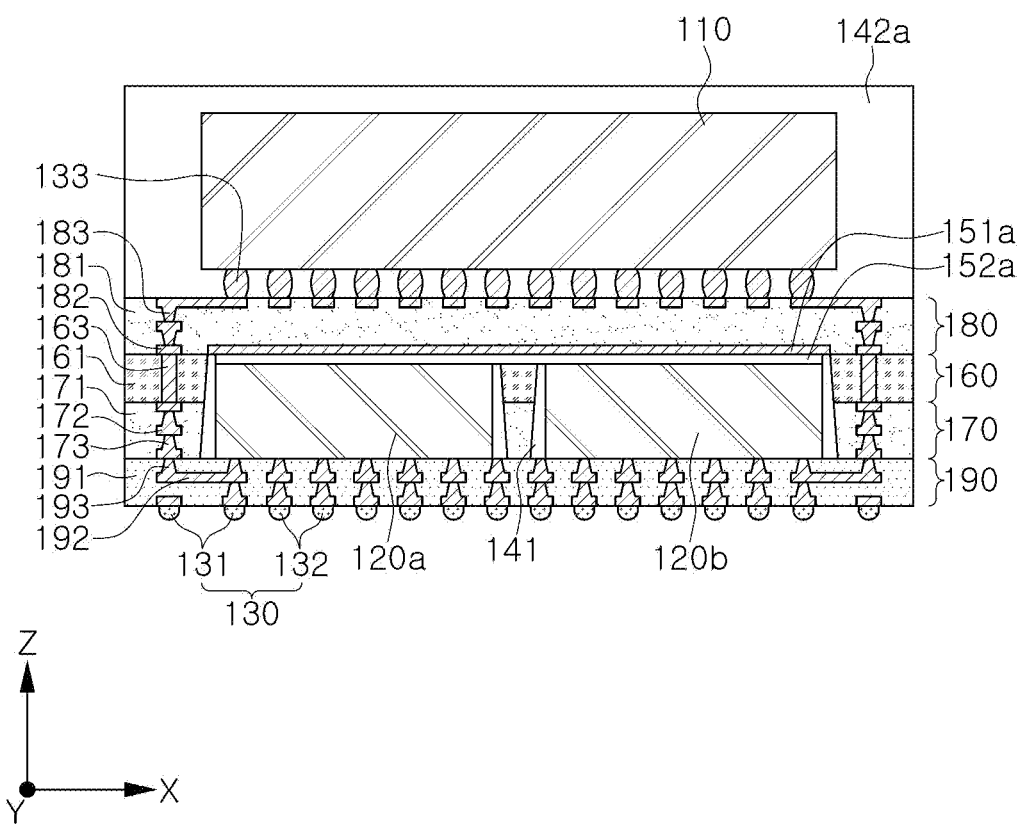
FIGS. 1A to 1D are side views illustrating an example chip radio frequency package according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of the application, may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

FIG. 1A is a side view illustrating an example chip radio frequency package, in accordance with one or more embodiments.

Referring to FIG. 1A, a radio frequency chip package 100a, in accordance with one or more embodiments, may include a radio frequency integrated circuit (RFIC) 110, a first front-end integrated circuit (FEIC) 120a, and a second FEIC 120b. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The RFIC 110 may input and/or output a base signal and a first radio frequency (RF) signal having a frequency higher than a frequency of the base signal.

For example, the RFIC 110 may process the base signal (e.g., frequency conversion, filtering, phase control, etc.) to generate a first RF signal, and process the first RF signal to generate a base signal.

The first FEIC 120a may input and/or output the first RF signal and a second RF signal having a power different from a power of the first RF signal.

For example, the first FEIC 120a may amplify a first RF signal to generate a second RF signal, and amplify a second RF signal to generate a first RF signal. In a non-limited example, the amplified second RF signal may be remotely transmitted by an antenna, and the second RF signal remotely received from the antenna may be amplified by the first FEIC 120a.

In an example, the first FEIC 120a may include at least a portion of a power amplifier, a low noise amplifier, and a transmission/reception conversion switch. The power amplifier, the low-noise amplifier, and the transmission/reception conversion switch may be implemented as a combination structure of a semiconductor transistor element and an impedance element, but is not limited thereto.

Since the first FEIC 120a may amplify the first RF signal and/or the second RF signal, the RFIC 110 may not include a front-end amplification circuit (e.g., a power amplifier, a low noise amplifier).

Since securing the performance (e.g., power consumption, linearity characteristics, noise characteristics, size, gain, etc.) of the front-end amplification circuit may be more difficult than securing the performance of a circuit performing operations other than amplification in the RFIC 110, compatibility of a circuit performing operations, other than amplification in the RFIC 110, may be relatively low.

In an example, the front-end amplification circuit may be implemented as a type of IC, other than a typical CMOS-based IC (for example, a compound semiconductor), or may be configured to have an efficient structure to receive impedance of a passive element, or may be optimized for a specific required performance to be implemented separately, thereby securing performance.

Accordingly, a chip radio frequency package 100a, in accordance with one or more embodiments, may have a structure in which the first FEIC 120a that performs a front-end amplification operation and the RFIC 110 that performs an operation other than the front-end amplification are implemented separately. As a result, the performance of the amplification circuit and the performance of a circuit performing operations other than front-end amplification of the RFIC 110 may be achieved.

Additionally, power consumption and/or heat generation of the front-end amplification circuit may be greater than power consumption and/or heat generation of the circuit that performs operations other than the front-end amplification of the RFIC 110.

The chip radio frequency package 100a, in accordance with one or more embodiments, may have a structure in which the first FEIC 120a that performs the front-end amplification operation, and the RFIC 110 that performs operations other than the front-end amplification are implemented separately, such that power consumption efficiency may be increased, and a heat generation path may be more efficiently distributed.

Energy loss when transmitting the first RF signal and/or the second RF signal may increase as the power of the first RF signal and/or the second RF signal increases.

In an example in which the first FEIC 120a or the second FEIS 120b that performs an front-end amplification operation and the RFIC 110 that performs operations other than the front-end amplification, since the FEIC 120 may be electrically connected closer to an antenna, an electrical length of a transmission path to an antenna of the final amplified second RF signal may be shortened more easily, and energy efficiency of the chip radio frequency package 100a may be further improved.

Although, in an example, a total size of the RFIC 110 and the first FEIC 120a may be greater than the size of the RFIC integrated with the front-end amplification circuit, the chip radio frequency package 100a, in accordance with one or more embodiments, may have a structure in which the RFIC 110 and the first FEIC 120a may be disposed in a compressed manner.

Referring to FIG. 1A, a chip radio frequency package 100a, in accordance with one or more embodiments, may include a substrate, and the substrate may include a core member 160, a first connection member 170, and a second connection member 180.

In an example, the core member 160 may include a core insulating layer 161 and a core via 163 disposed to penetrate the core insulating layer 161.

In an example, the first connection member 170 may have a first stacked structure in which at least one first insulating layer 171 and at least one first wiring layer 172 are alternately stacked. The at least one first wiring layer 172 may be electrically connected to the core via 163, and may be disposed on a lower surface of the core member 160.

In an example, the first connection member 170 may have a structure built up in a downward direction of the core member 160. In other words, the first connection member 170 may be disposed below the core member 160. Therefore, a first via 173, that may be included in the first connection member 170, may have a structure in which a width of a lower end thereof is longer than, or greater than, a width of an upper end thereof.

The second connection member 180 may have a second stacked structure in which at least one second insulating layer 181 and at least one second wiring layer 182 are alternately stacked. The at least one second wiring layer 182 may be electrically connected to the core via 163, and may be disposed on an upper surface of the core member 160.

In an example, the second connection member 180 may have a structure that is built up in an upward direction of the core member 160. In other words, the second connection member 180 may be disposed above the core member 160. Therefore, a second via 183, that may be included in the second connection member 180, may have a structure in which a width of an upper end thereof is longer than, or greater than, a width of a lower end thereof.

The RFIC 110 may be disposed on an upper surface of the second connection member 180, and may input and/or output a base signal and a first RF signal, through at least one second wiring layer 182.

The core member 160 and the first connection member 170 may surround a first cavity in which the first FEIC 120a is disposed in a horizontal direction (e.g., an x-direction, a y-direction), and the second connection member 180 may be disposed to overlap in a vertical direction (e.g., a z-direction) in the first cavity. That is, the first cavity may have a recessed structure having a same thickness of the substrate.

Accordingly, since the RFIC 110 and the first FEIC 120a may be disposed in a compressed manner with each other, an actual size of the chip radio frequency package 100a in accordance with one or more embodiments may be reduced, and may be less than or equal to the size of a chip radio frequency package implemented with an RFIC integrated with a front-end amplification circuit.

Additionally, since the second connection member 180 may be disposed between the RFIC 110 and the first FEIC 120a, electromagnetic isolation between the RFIC 110 and the first FEIC 120a may be improved.

Referring to FIG. 1A, a radio frequency chip package 100a, in accordance with one or more embodiments, may further include a third connection member 190 disposed on a lower surface of the first connection member 170.

The third connection member 190 may have a third stacked structure in which at least one third insulating layer 191 and at least one third wiring layer 192 are alternately stacked.

In an example, the third connection member 190 may have a structure that is built up in a downward direction of the core member 160. In other words, the third connection member 190 may be disposed below the core member 160, and below the first connection member. Therefore, a third via 193, that may be included in the third connection member 190, may have a structure in which a width of a lower end thereof is longer than, or greater than, a width of an upper end thereof.

A plurality of electrical connection structures 130 may be disposed on the lower surface of the third connection member 190. In a non-limiting example, the plurality of electrical connection structures 130 may be implemented with solder balls, pads, or lands.

A first FEIC 120a may be disposed on the upper surface of the third connection member 190.

In an example, the first FEIC 120a may input or output first and second RF signals in a downward direction. Accordingly, since wiring complexity of the second connection member 180 may be reduced, the second connection member 180 may stably provide a dispositional space of the wiring electrically connected to the RFIC 110. Additionally, electromagnetic isolation between the RFIC 110 and the first FEIC 120a may be further improved.

The first electrical connection structure 131 of the plurality of electrical connection structures 130 may provide an electrical connection path to the exterior of the RFIC 110, and the second electrical connection structure 132 thereof may provide an electrical connection path to the exterior of the first FEIC 120a.

Referring to FIG. 1A, the chip radio frequency package 100a, in accordance with one or more embodiments, may further include a cavity cover layer 151a in which at least a portion thereof is disposed on an upper surface of a first cavity, and is surrounded by a core member 160 or a second connection member 180 in a horizontal direction (e.g., an x-direction, or a y-direction).

The cavity cover layer 151a may be used as a stopper to stop a process of forming a first cavity. Therefore, a difference between a height of the first cavity and a height of the first FEIC 120a may be reduced. Accordingly, since the first FEIC 120a and the RFIC 110 may be more compressively disposed, an actual size of the chip radio frequency package 100a may be further reduced.

In an example, an adhesive layer 152a may be disposed between the cavity cover layer 151a and the first FEIC 120a, so that the first FEIC 120a may be stably adhered to the lower surface of the cavity cover layer 120a.

In a non-limiting example, the side surface of the first cavity may be inclined. That is, an inner wall facing the first FEIC 120a from the core member 160 and the first connection member 170 may be inclined. Specifically, in an example, a horizontal width of a portion corresponding to the upper surface of the core member 160 in the first cavity may be smaller than a horizontal width of a portion corresponding to the lower surface of the core member 160.

The inclined side surface of the first cavity may be formed due to an asymmetrical structure in the vertical direction of the first cavity in the substrate according to which the first cavity is not formed in the second connection member 180.

In an example, a first encapsulant 141 may be filled in a portion of the first cavity where the first FEIC 120a is not positioned.

In an example, a second encapsulant 142a may encapsulate at least a portion of the RFIC 110 on the upper surface of the second connection member 180. Accordingly, in an example, the chip radio frequency package 100a may be a standardized electronic component, and may have a structure that is easy to be mass-produced, distributed, and used, and the RFIC 110 may be protected from the external influences.

Referring to FIG. 1A, a chip radio frequency package 100a, in accordance with one or more embodiments, may further include a second FEIC 120b.

The core member 160 and the first connection member 170 may surround a second cavity in which the second FEIC 120b may be disposed in a horizontal direction (e.g., an x-direction, or a y-direction), and the second connection member 180 may be disposed to overlap in a vertical direction (e.g., a z-direction) in the second cavity. That is, the second cavity may have a structure that is recessed by a thickness of the substrate.

At least a portion of at least one of the first FEIC 120a and the second FEIC 120b may overlap the RFIC 110 in the vertical direction (e.g., the z-direction).

In an example, the first FEIC 120a and the second FEIC 120b may be disposed in the first and second cavities, which are spaced apart from each other. Accordingly, electromagnetic isolation between the first FEIC 120a and the second FEIC 120b may be improved, and each of the first FEIC 120a and the second FEIC 120b may dissipate heat more efficiently.

In an example, since the first and second cavities may be formed substantially simultaneously, a cavity cover layer 151a may be disposed to overlap both the first and second cavities in the vertical direction (e.g., the z-direction).

For example, since the second cavity may have the same shape as the first cavity, a side surface of the second cavity may be inclined.

When the total horizontal width of the first and second cavities is greater relative to the total horizontal width of the substrate, structural stability of the substrate may be decreased, and warpage of the substrate may be increased.

When the first and second cavities have an asymmetrical structure in the vertical direction in the substrate, the total horizontal width of the first and second cavities relative to the total horizontal width of the substrate may be widened more easily than the total horizontal width of the first and second cavities when the first and second cavities are formed to penetrate the entire substrate.

Therefore, the chip radio frequency package 100a, in accordance with one or more embodiments, may stably include the first and second cavities even if it has a relatively small horizontal width, and may use the first FEIC 120a and the second FEIC 120b together, even if it has a relatively small horizontal width.

The second FEIC 120b may input and/or output a third RF signal and a fourth RF signal, where the fourth RF signal may have a power different from a power of the third RF signal.

In an example, a fundamental frequency of the first and second RF signals input and/or output from the first FEIC 120a may be different from a fundamental frequency of the third and fourth RF signals input and/or output from the second FEIC 120b.

That is, the chip radio frequency package 100a, in accordance with one or more embodiments, may support multi-frequency band communication. Since the chip radio frequency package 100a may use the first FEIC 120a and the second FEIC 120b together, even if it has a relatively small horizontal width, multiple-frequency band communication may be supported efficiently, even if it has a relatively small horizontal width.

In an example, the first FEIC 120a may amplify a first RF signal to output a second RF signal, and the second FEIC 120b may receive a third RF signal and amplify the third RF signal to output a fourth RF signal. The RFIC 110 may convert a base signal into a first RF signal, and convert a fourth RF signal into a base signal.

That is, the first FEIC 120a may be used for signal transmission, and the second FEIC 120b may be used for signal reception. Accordingly, since the first FEIC 120a and the second FEIC 120b may not include a switch for switching between transmission and reception, respectively, they may have a further reduced size. Accordingly, the size of the chip radio frequency package 100a may be further reduced.

Figure 1B:
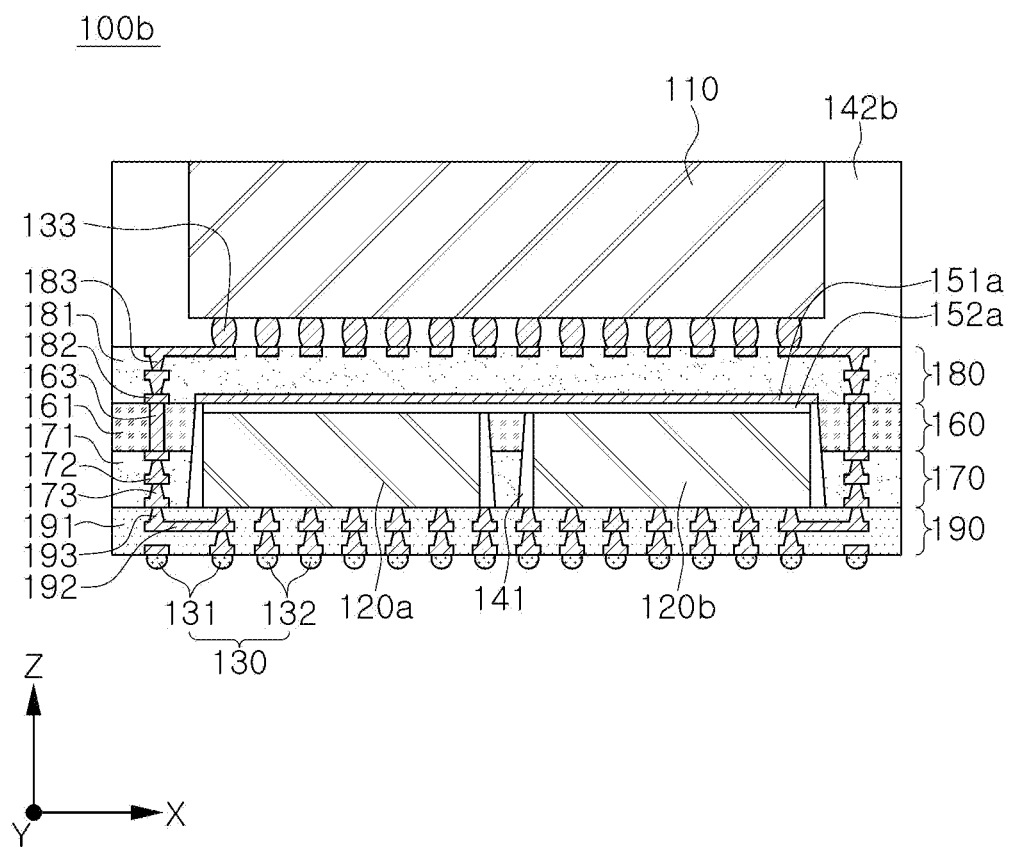
Figure 1C:
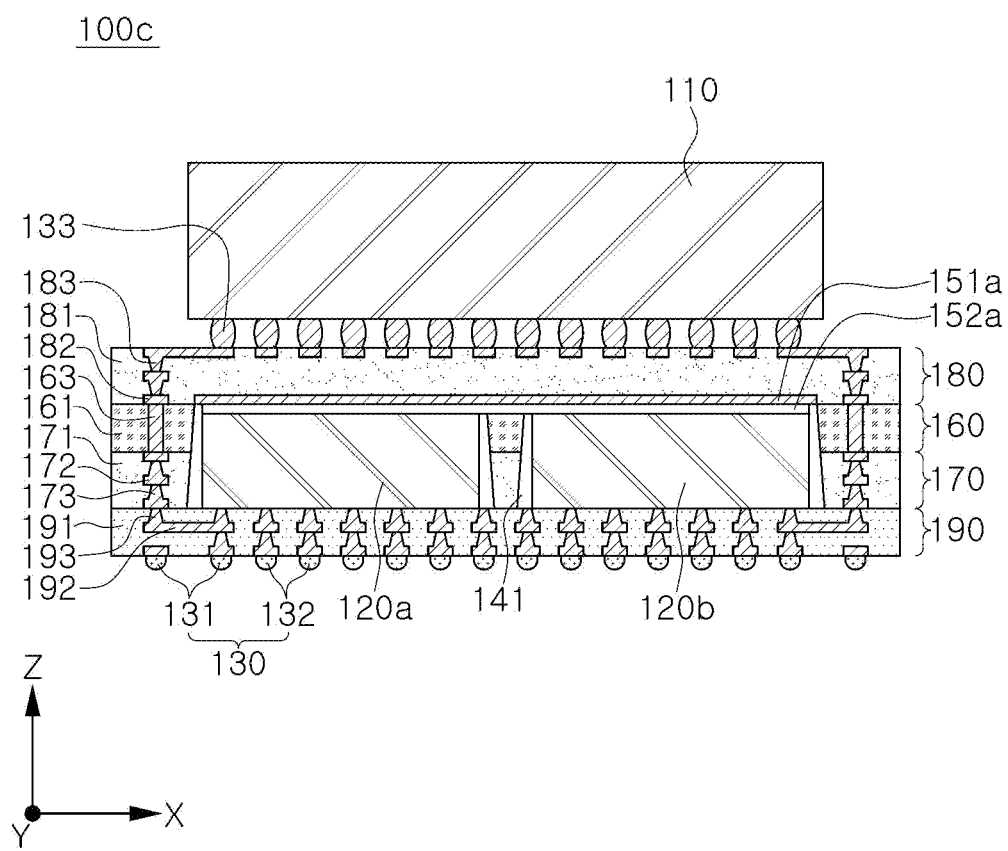
Figure 1D:
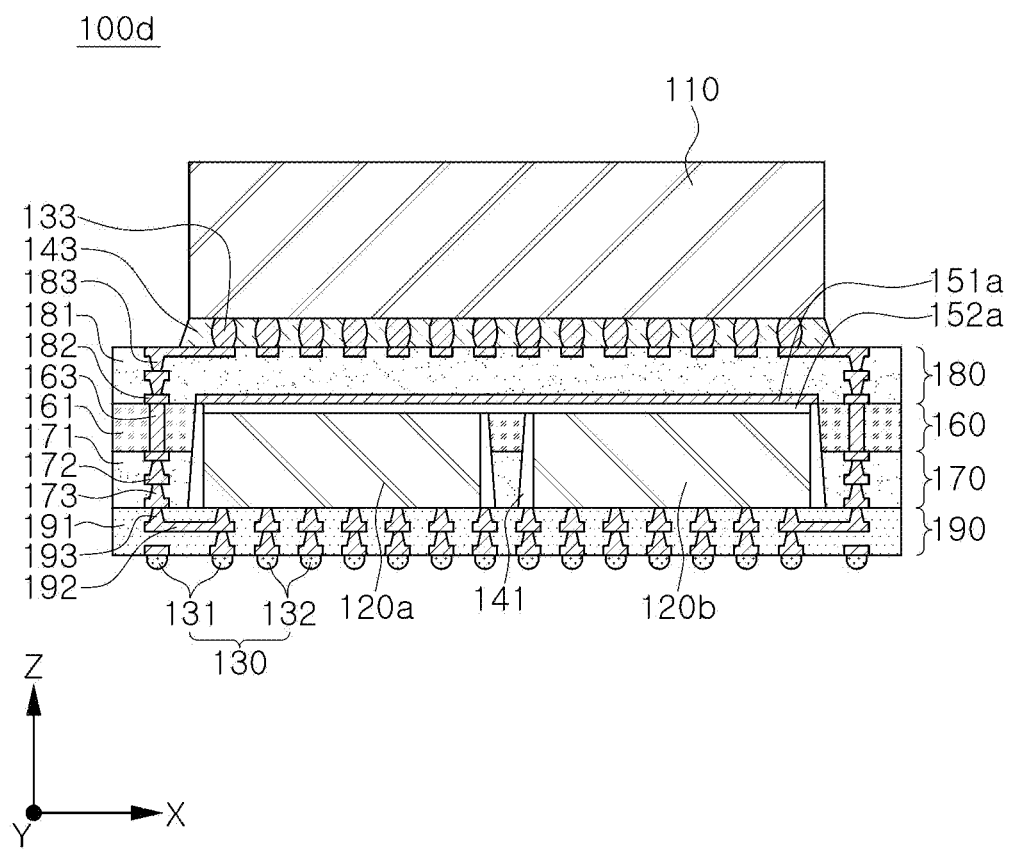

FIGS. 1B to 1D are side views illustrating an example chip radio frequency package, in accordance with one or more embodiments.

Referring to FIG. 1B, an example chip radio frequency package 100b, in accordance with one or more embodiments, may include a second encapsulant 142b, which may have a shorter thickness than the second encapsulant 142a illustrated in FIG. 1A.

Referring to FIG. 10, an example chip radio frequency package 100c, in accordance with one or more embodiments, may have a structure in which the second encapsulant 142a and 142b respectively illustrated in FIG. 1A or 1B, is omitted.

Referring to FIG. 1D, an example chip radio frequency package 100d, in accordance with one or more embodiments, may include a third encapsulant 143 encapsulating a plurality of third electrical connection structures 133. The plurality of third electrical connection structures 133 may be mounted on the upper surface of the second connection member 180 of the RFIC 110.

Figure 2A:
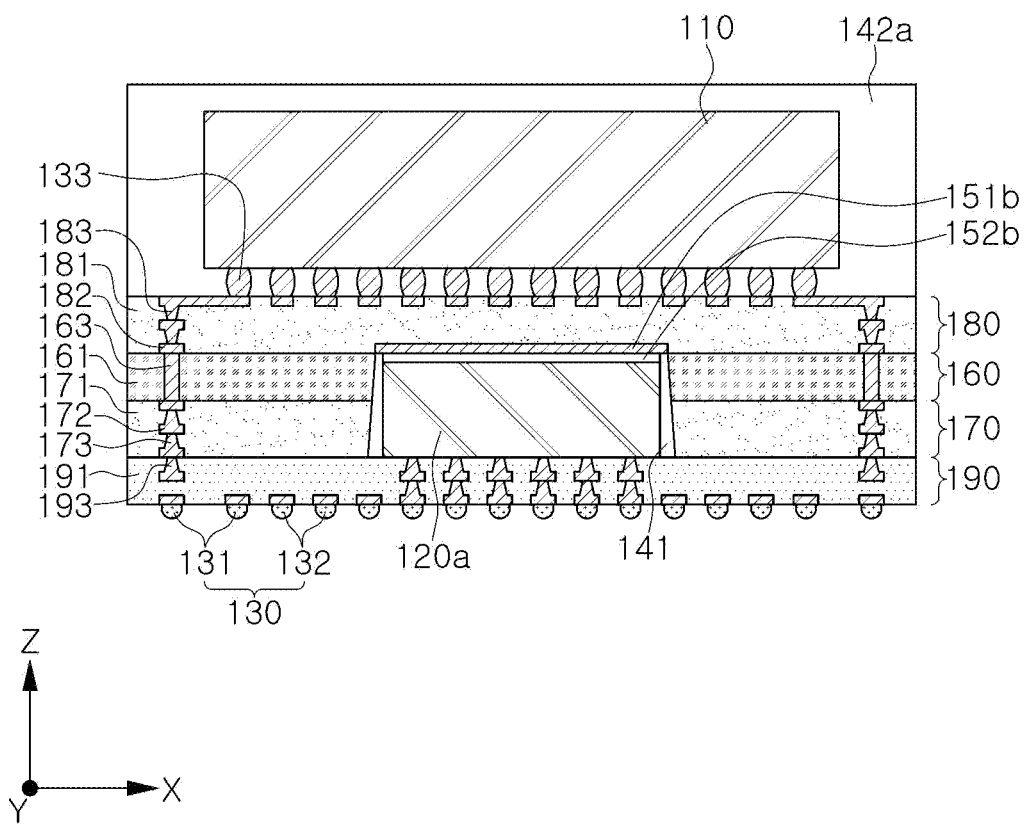
FIGS. 2A to 2C are side views illustrating an example chip radio frequency package according to one or more embodiments.
Figure 2B:
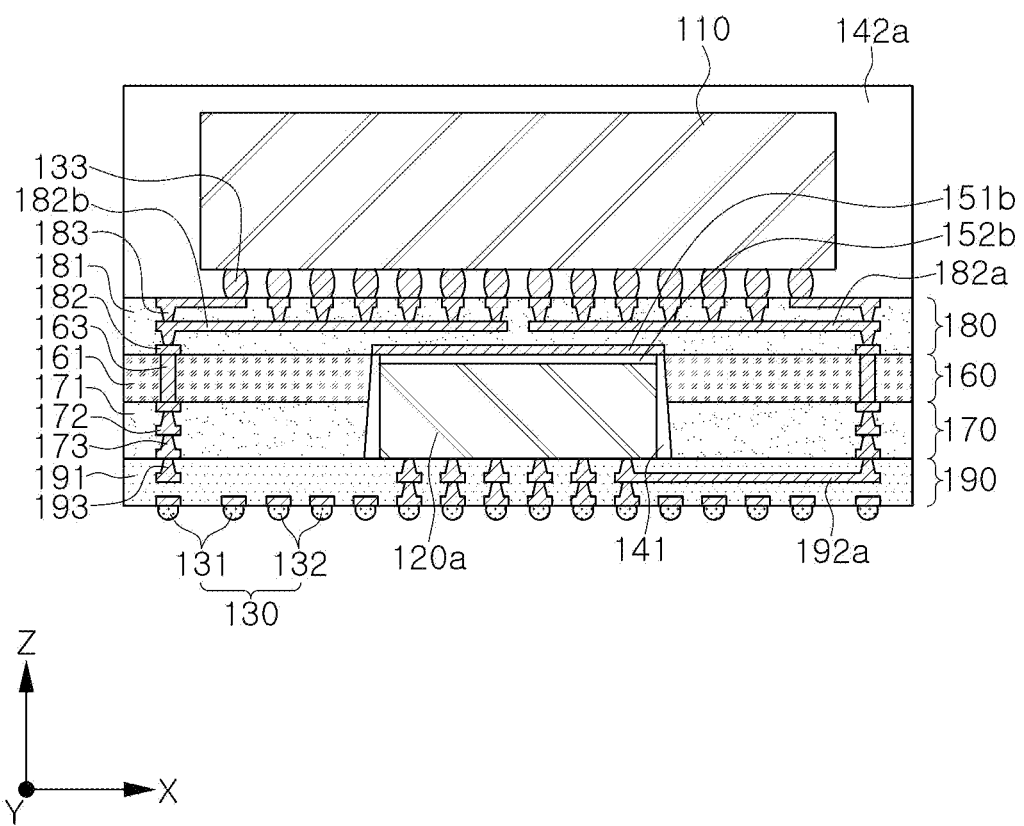
Figure 2C:
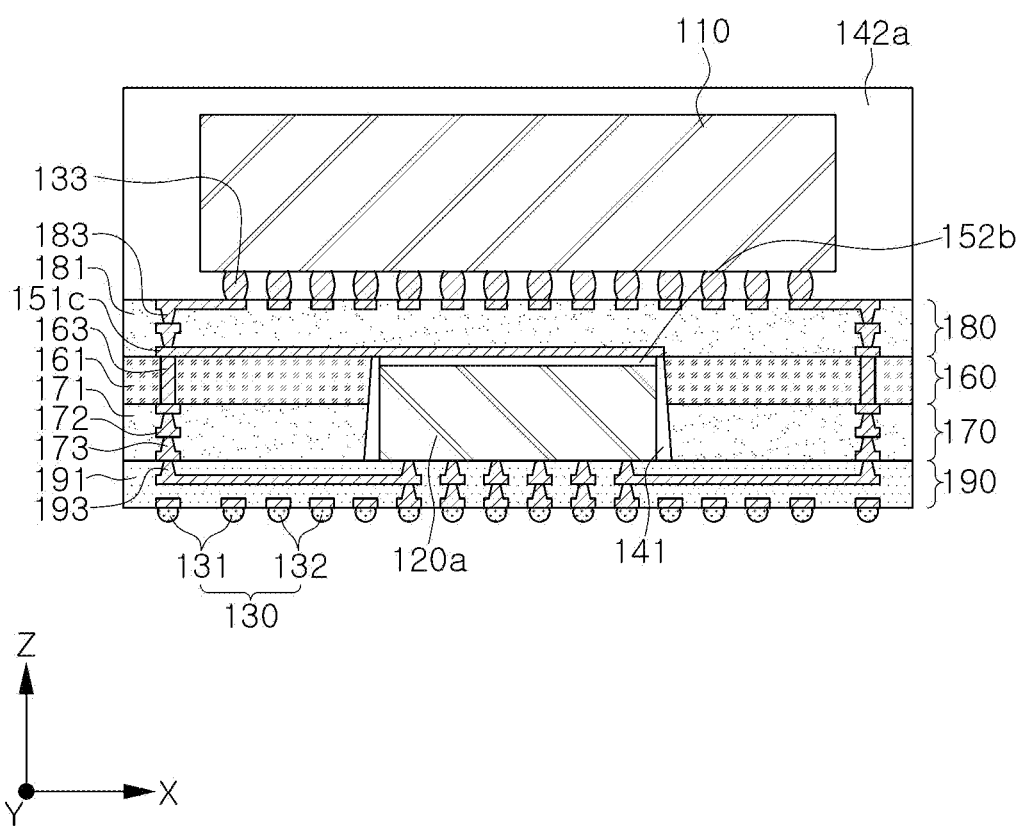

FIGS. 2A to 2C are side views illustrating an example chip radio frequency package, in accordance with one or more embodiments.

Referring to FIG. 2A, an example chip radio frequency package 100e, in accordance with one or more embodiments, may have a structure in which the second FEIC 120b illustrated in FIG. 1A, is omitted.

Referring to FIG. 2B, an example chip radio frequency package 100f, in accordance with one or more embodiments, may include second wiring layers 182a and 182b modified in a structure of at least one second wiring layer shown in FIG. 1A, and may have a third wiring layer 192a modified in a structure of at least one third wiring layer shown in FIG. 1A.

Referring to FIG. 2C, an example chip radio frequency package 100g, in accordance with one or more embodiments, may include a cavity cover layer 151c electrically connected to at least one second via 183. That is, the cavity cover layer 151c may be electrically connected to the RFIC 110.

In an example, the cavity cover layer 151c may be in an electrically stable ground state, thereby providing a ground to the RFIC 110. Since the cavity cover layer 151c may have a relatively wide horizontal width, the cavity cover layer 151c may have a more electrically stable state, and may provide a more stable ground to the RFIC 110. Additionally, since the cavity cover layer 151c is an electrically stable ground state, electromagnetic isolation between the RFIC 110 and the first FEIC 120a may be further improved.

Figure 3:
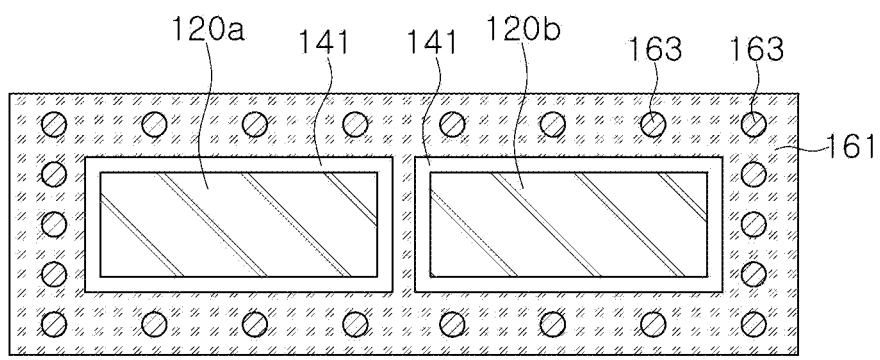
FIG. 3 is a plan view illustrating an example chip radio frequency package according to one or more embodiments.
Figure 3:
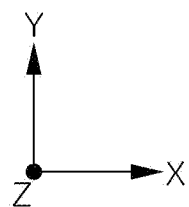

FIG. 3 is a plan view illustrating a chip radio frequency package, in accordance with one or more embodiments.

Referring to FIG. 3, the core insulating layer 161 of the example chip radio frequency package 100a may surround the first FEIC 120a and the second FEIC 120b, respectively, and may include a plurality of core vias 163.

FIGS. 4A to 4D are side views illustrating an example chip radio frequency package, in accordance with one or more embodiments.

Figure 4A:
FIGS. 4A to 4D are side views illustrating a process of manufacturing a chip radio frequency package according to one or more embodiments.
Figure 4A:
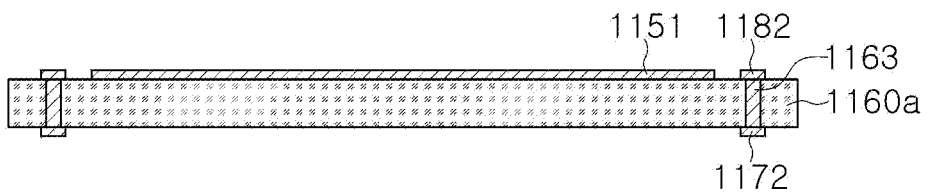
Figure 4A:
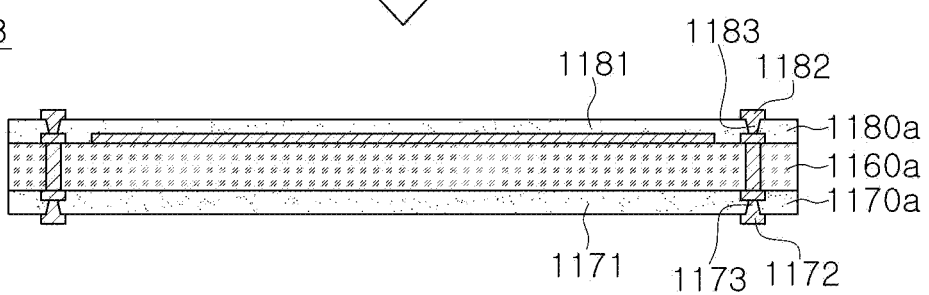
Figure 4A:
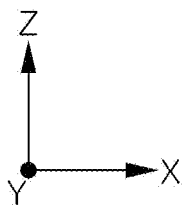

Referring to FIG. 4A, in a first operation 1001, a portion in which a core via is to be disposed in a core member 1160a may be removed.

Referring to FIG. 4A, in a second operation 1002, the core via 1163 may be formed to penetrate the core member 1160a, and a cavity cover layer 1151 and a second wiring layer 1182 may be disposed on an upper surface of the core insulating member 1160a, and a first wiring layer 1172 may be disposed on a lower surface of the core member 1160a.

Referring to FIG. 4A, in a third operation 1003, a first insulating layer 1171 may be disposed on the lower surface of the core member 1160a, a first via 1173 may be formed in the first insulating layer 1171, a second insulating layer 1181 may be disposed on an upper surface of the core member 1160a, and a second via 1183 may be formed on the second insulating layer 1181. Accordingly, some layers of the first connection member 1170*a* may be formed, and some layers of the second connection member 1180*a* may be formed.

Figure 4B:
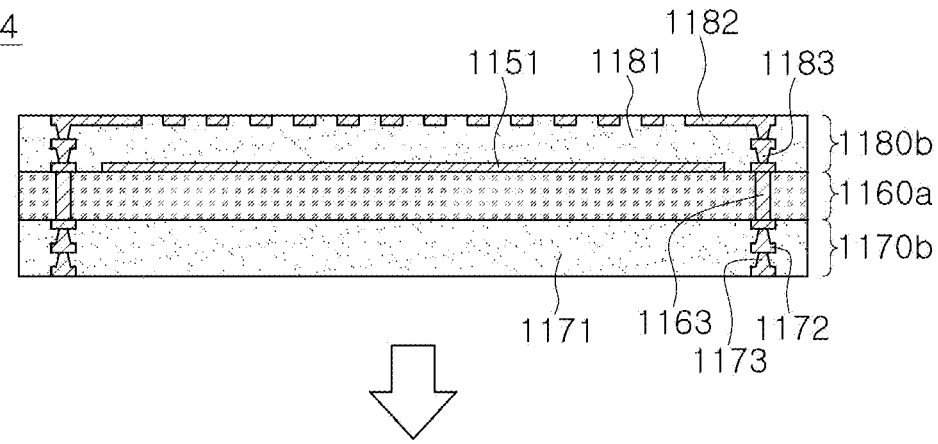
Figure 4B:
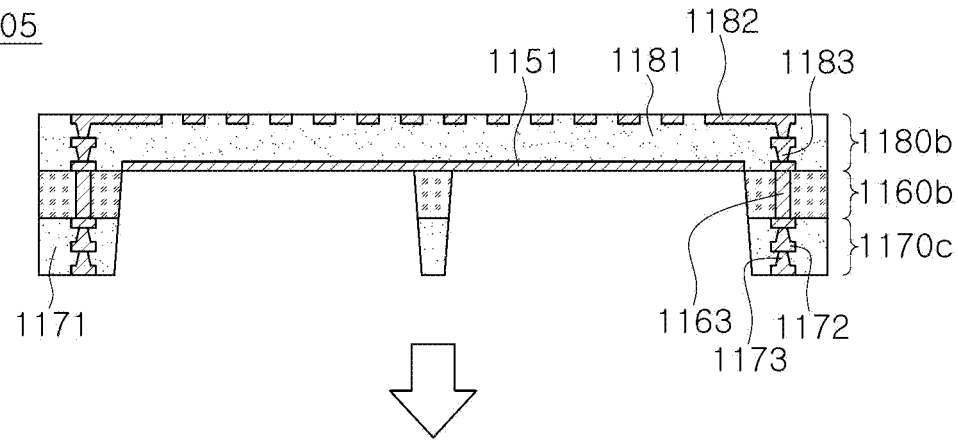
Figure 4B:
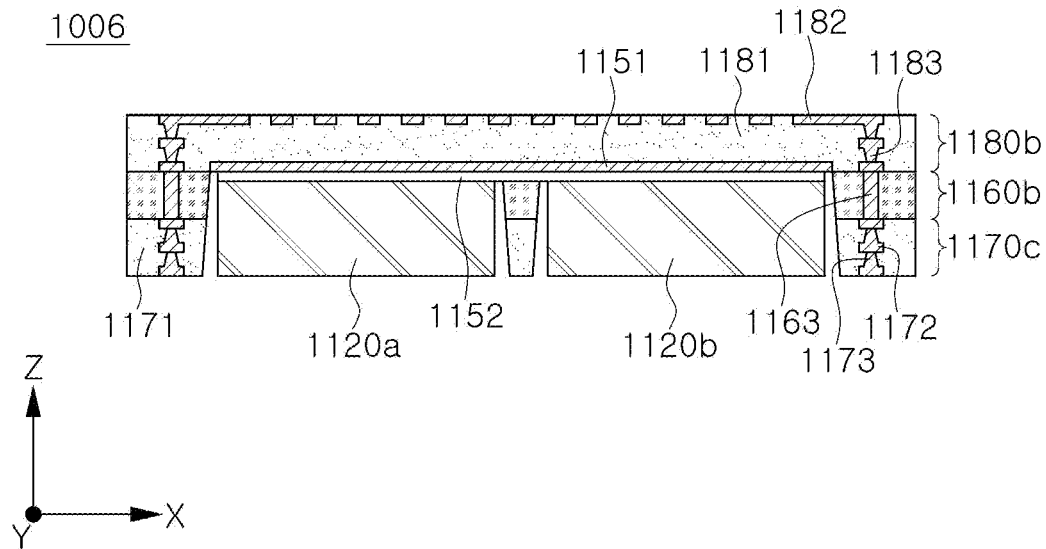

Referring to FIG. 4B, in a fourth operation 1004, a total thickness of each of the first and second insulating layers 1171 and 1181 may be thicker than a total thickness of the first and second insulating layers 1171 and 1181 as illustrated in operation 1003 of FIG. 4A, the first and second wiring layers 1172 and 1182 may be further stacked than a stacking of the first and second wiring layers 1172 and 1182 as illustrated in operation 1003 of FIG. 4A, and the first and second vias 1173 and 1183 may be longer than the first and second vias 1173 and 1183 as illustrated in operation 1003 of FIG. 4A. Accordingly, the number of stacked layers of the first connection member 1170*b* may increase, and the number of stacked layers of the second connection member 1180*b* may increase.

Referring to FIG. 4B, in a fifth operation 1005, first and second cavities may be formed in a core member 1160*b* and a first connection member 1170*c*. For example, the first and second cavities may be formed as a plurality of fine particles or lasers collide in a specific region of the core member 1160*b* and the first connection member 1170*c* in a +z-direction.

Referring to FIG. 4B, in a sixth operation 1006, an adhesive layer 1152 may be disposed in the first and second cavities, and the first and second FEICs 1120*a* and 1120*b* may be disposed in the first and second cavities, respectively.

Figure 4C:
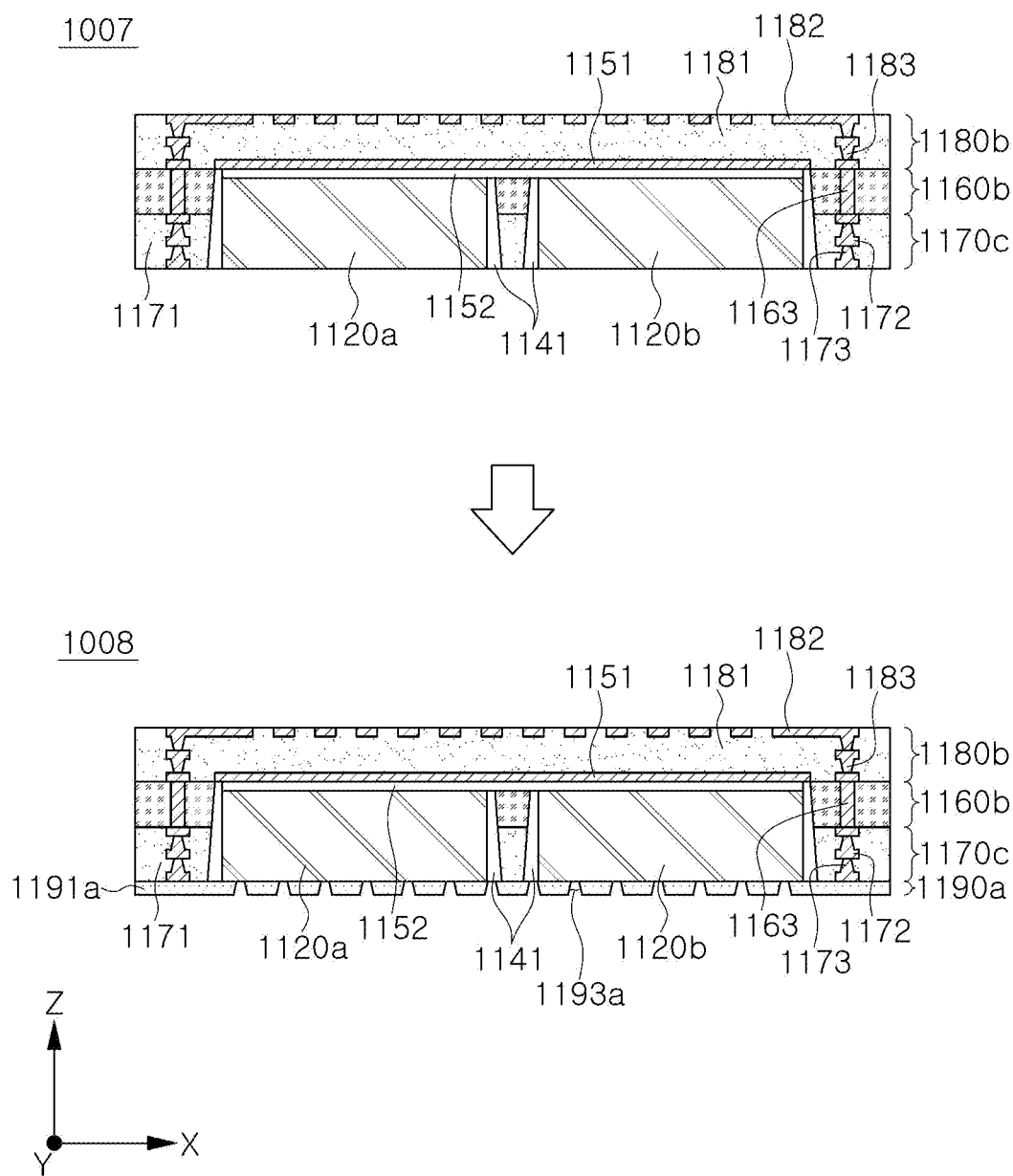

Referring to FIG. 4C, in a seventh operation 1007, a first encapsulant 1141 may be filed in a portion of the first and second cavities where the respective first and second FEICs 1120*a* and 1120*b* are not disposed.

Referring to FIG. 4C, in an eighth operation 1008, a third insulating layer 1191*a* may be disposed on a lower surface of the first connection member 1170*c*, and may have a dispositional space of the third via 1193*a*. Accordingly, some layers of the third connection member 1190*a* may be formed.

Figure 4D:
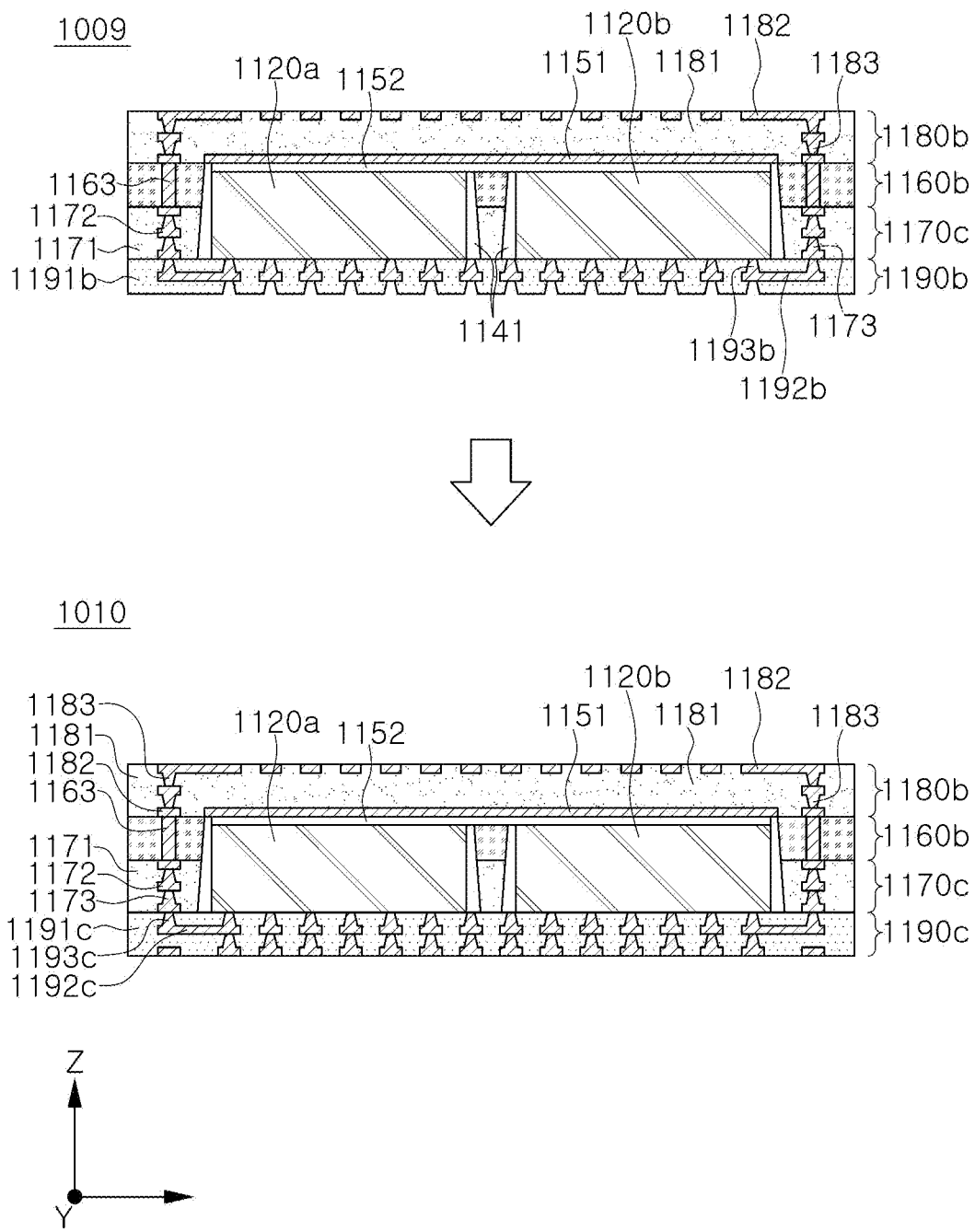

Referring to FIG. 4D, in a ninth operation 1009, a total thickness of the third insulating layer 1191*b* may be thicker than a thickness of third insulating layer 1191*a* of FIG. 4C, and the third wiring layer 1192*b* and the third via 1193*c* may be formed in the third insulating layer 1191*b*. Accordingly, the number of stacked layers of the third connection member 1190*b* may increase.

Referring to FIG. 4D, in a tenth operation 1010, the total thickness of the third insulating layer 1191*c* may be thicker than a thickness of third insulating layer 1191*a* of FIG. 4C, and the third wiring layer 1192*c* and the third via 1193*c* may be further formed in the third insulating layer 1191*c*. Accordingly, the number of stacked layers of the third connection member 1190*c* may further be increased.

Figure 5A:
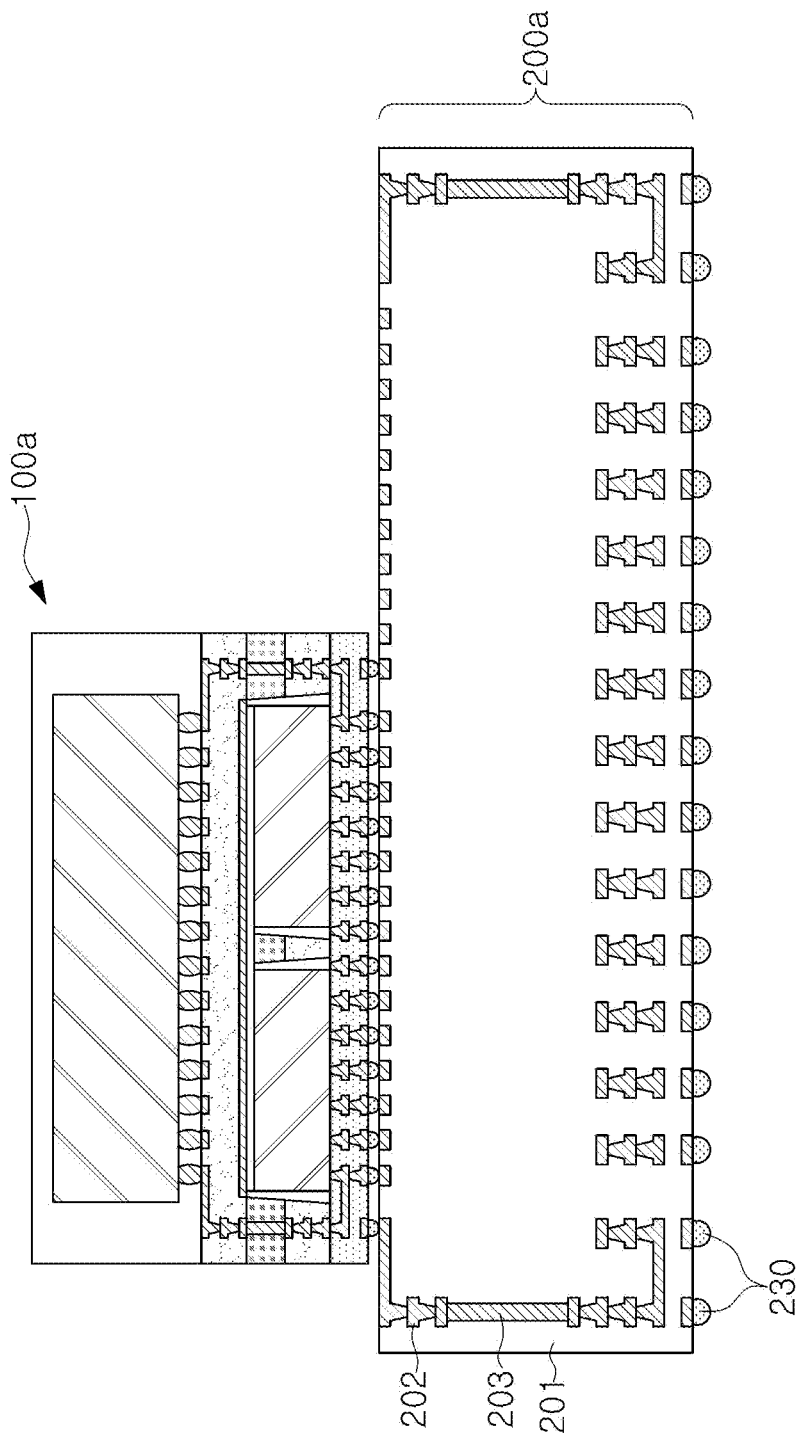
FIGS. 5A and 5B are side views illustrating an example radio frequency module according to one or more embodiments.
Figure 5B:
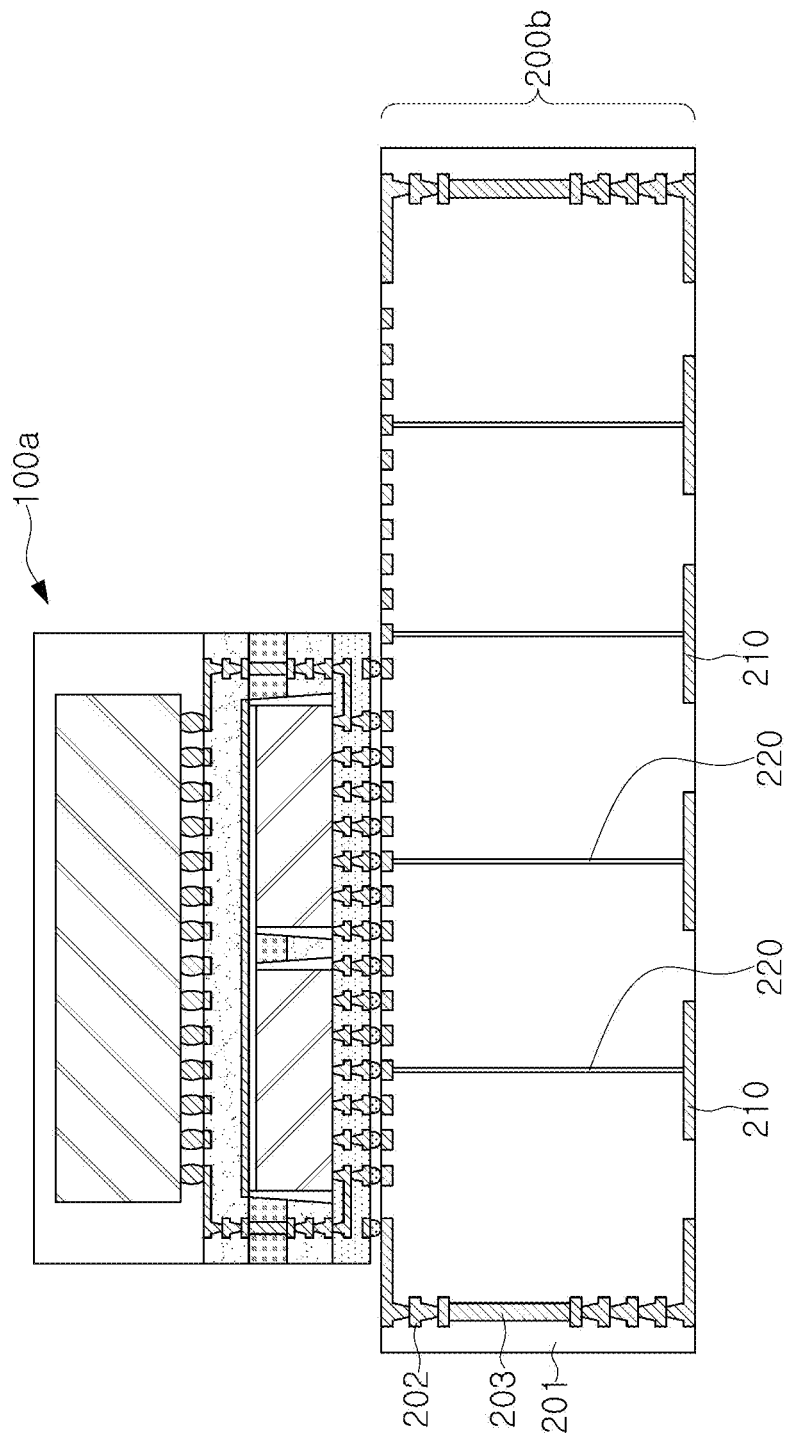

FIGS. 5A and 5B are side views illustrating an example radio frequency module, in accordance with one or more embodiments.

Referring to FIG. 5A, an example radio frequency module may include a chip radio frequency package 100*a* and a second substrate 200*a*.

The second substrate 200*a* may have a structure in which a fourth insulating layer 201, a fourth wiring layer 202, and a fourth via 203 are combined, and may have a structure similar to a structure of the printed circuit board (PCB).

As the number of stacked layers of connection members of the chip radio frequency package 100*a* increases, the number of the fourth insulating layer 201 and the fourth wiring layer 202 of the second substrate 200*a* may decrease, so that the thickness of the second substrate 200*a* may be thinned.

The chip radio frequency package 100*a* may be mounted on the upper surface of the second substrate 200*a* through the first and second electrical connection structures, and may be electrically connected to the fourth wiring layer 202 and the fourth via 203.

A horizontal width of the chip radio frequency package 100*a* may be smaller than, or less than, a width of the upper surface of the second substrate 200*a*. Therefore, the chip radio frequency package 100*a* may be used as one electronic component in terms of the second substrate 200*a*.

A plurality of fourth electrical connection structures 230 may be disposed on a lower surface of the second substrate 200*a*, and may be electrically connected to the fourth wiring layer 202 and the fourth via 203.

The plurality of fourth electrical connection structures 230 may support mounting of a chip antenna, and the chip antenna may remotely transmit and/or receive the second RF signal. Additionally, a portion of the plurality of fourth electrical connection structures 230 may be used as input and/or output paths of the base signal.

Referring to FIG. 5B, a second substrate 200*b* may further include a plurality of patch antenna patterns 210 and a plurality of feed vias 220.

The plurality of patch antenna patterns 210 may be formed together with the wiring layer of the second substrate 200*b*, may remotely transmit and/or receive the second RF signal, and may be fed from the plurality of feed vias 220.

Figure 6A:
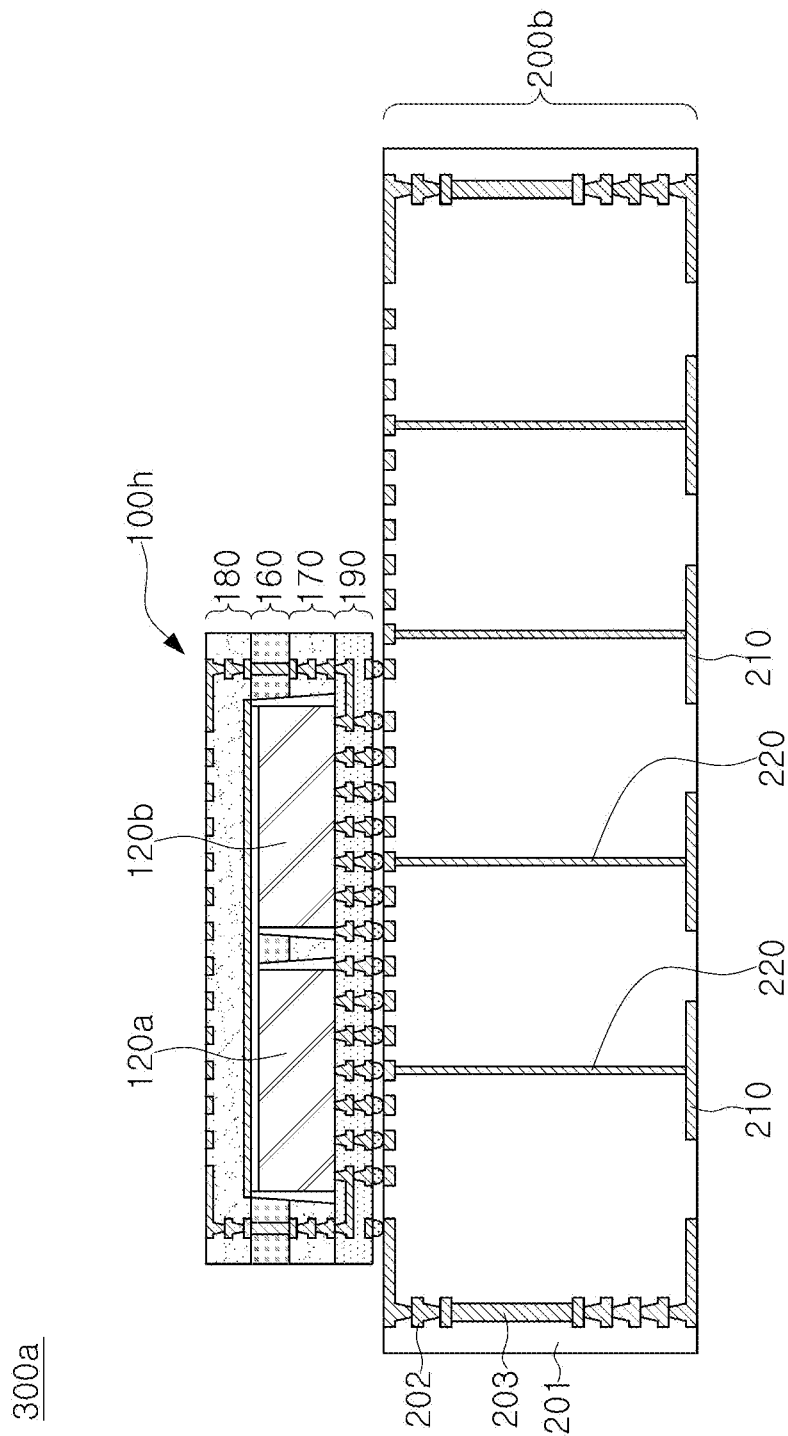
FIG. 6A is a side view illustrating a structure in which an RFIC is omitted in a radio frequency module according to an embodiment of the present disclosure.

FIG. 6A is a side view illustrating a structure in which an RFIC is omitted in a radio frequency module according to an embodiment of the present disclosure.

Referring to FIG. 6A, a radio frequency module 300*a* according to an embodiment of the present disclosure may have a structure in which a chip radio frequency package 100*h* in which an RFIC is omitted is mounted on an upper surface of a second substrate 200*b*.

That is, a dispositional position of the RFIC is not limited to the chip radio frequency package 100*h*. For example, the RFIC may be disposed on the second substrate 200*b*, or may be disposed on a base substrate that can be coupled to the upper surface of the chip radio frequency package 100*h*.

Figure 6B:
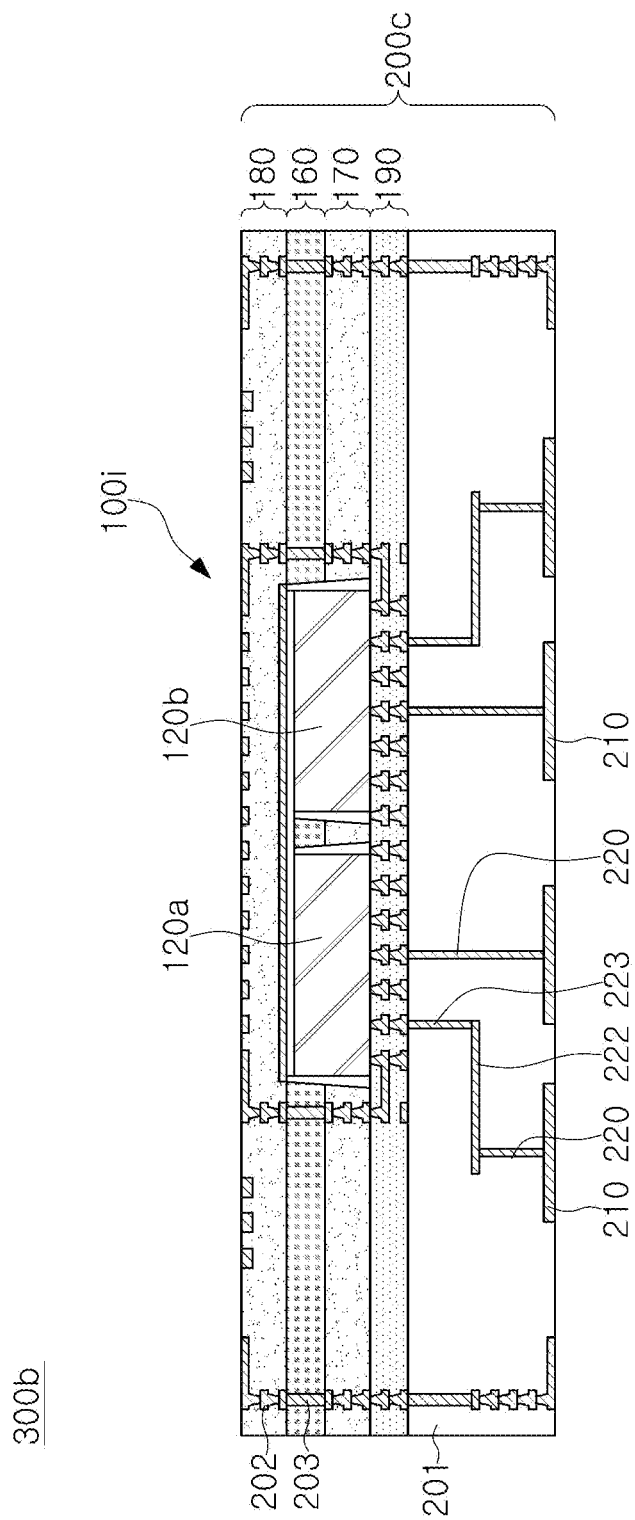
FIG. 6B is a side view illustrating a structure in which a chip radio frequency package is merged (built-in) with a second substrate in the radio frequency module according to an embodiment of the present disclosure.

FIG. 6B is a side view illustrating a structure in which a chip radio frequency package is merged (built-in) with a second substrate in the radio frequency module according to an embodiment of the present disclosure.

Referring to FIG. 6B, a radio frequency module 300*b* according to an embodiment of the present disclosure may have a structure in which a chip radio frequency package 100*i* is merged (built-in) with a second substrate 200*c*.

A third connection member 190, a first connection member 170, a core member 160, and a second connection member 180 of the chip radio frequency package 100*i* may be sequentially disposed on the second substrate 200*c*. For example, the chip radio frequency package 100*i* and an upper surface of the second substrate 200*c* may be coupled to each other through an adhesive material.

First and second FEICs 120*a* and 120*b* may be embedded in a coupling structure between the chip radio frequency package 100*i* and the second substrate 200*c*. Accordingly, an electrical length between the first and second FEICs 120*a* and 120*b* and a patch antenna pattern 210 may be shorter, and energy loss of a feed path may be further reduced. The feed path may include a feed via 220, a feed line 222 and a second feed via 223.

The number of patch antenna patterns 210 and the number of feed vias 220 may be four or more, respectively. The greater the number of patch antenna patterns 210, the higher a gain and a maximum output of the radio frequency module 300b according to an embodiment of the present disclosure, and a size of the radio frequency module 300b in a horizontal direction may be increased.

Since the gain and maximum output of the radio frequency module 300b may be increased due to the amplification of the first and second FEICs 120a and 120b, the number of the patch antenna patterns 210, as compared to the gain and the maximum output thereof and the size of the radio frequency module 300b, may be reduced due to at least one of the first and second FEICs 120a and 120b.

At least two of at least four feed vias 220 may be electrically connected to the first FEIC 120a, and a remainder thereof may be electrically connected to the second FEIC 120b.

Accordingly, since a horizontal distance in a feed path of the at least four patch antenna patterns 210 may be shorter, an electrical length between the first and second FEICs 120a and 120b and the at least four patch antenna patterns 210 may be shorter, energy loss of the feed path may be further reduced.

Figure 6C:
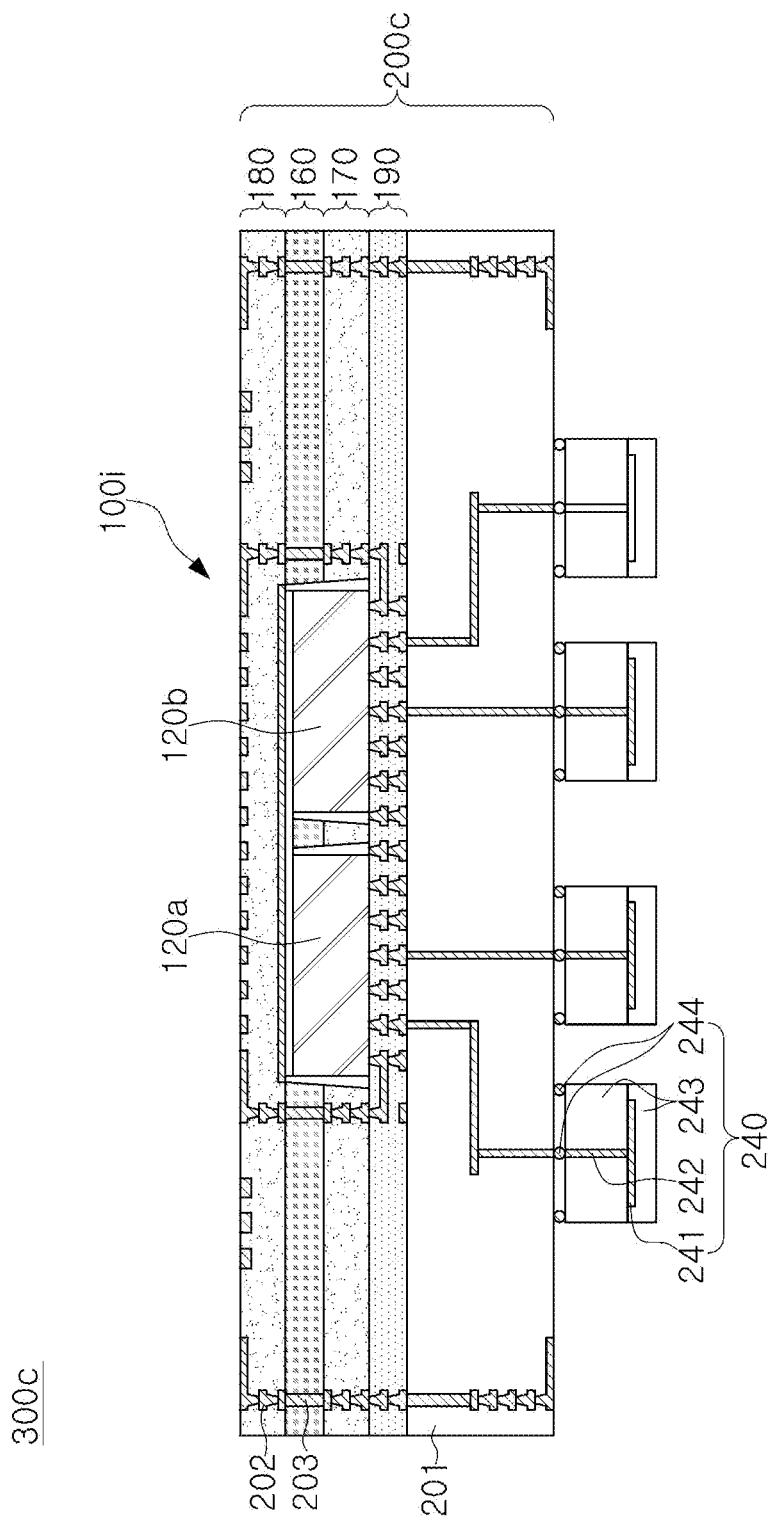
FIG. 6C is a side view illustrating a chip antenna that may be included in the radio frequency module according to an embodiment of the present disclosure.

FIG. 6C is a side view illustrating a chip antenna that can be included in the radio frequency module according to an embodiment of the present disclosure.

Referring to FIG. 6C, a radio frequency module 300c according to an embodiment of the present disclosure may further include a chip antenna 240, and the chip antenna 240 may include a patch antenna pattern 241, a feed via 242, a dielectric layer 243, and an electrical connection structure 244.

The dielectric layer 243 may have a higher dielectric constant than that of a fourth insulating layer 201 of the second substrate 200c. For example, the dielectric layer 243 may be made of ceramic, and thus have a relatively high dielectric constant.

Since the chip antenna 240 is separately manufactured for the remaining structure of the radio frequency module 300c and can be disposed on the radio frequency module 300c, the dielectric layer 243 may be made of a material, different from a material of the fourth insulating layer 201 of the second substrate 200c (for example: prepreg), and may be implemented in a method selected from among more varied and freer methods than that of the fourth insulating layer 201.

Accordingly, the chip antenna 240 may have improved antenna performance (e.g., gain, bandwidth, maximum output, and polarization efficiency) compared to a size.

For example, the dielectric layer 243 may be comprised of a material having a relatively high dielectric constant, such as a ceramic-based material such as a low temperature co-fired ceramic (LTCC), or a glass-based material or a material having a relatively low dielectric tangent such as teflon, and may be configured to have a higher dielectric constant or stronger durability further containing at least one of magnesium (Mg), silicon (Si), aluminum (Al), calcium (Ca), and titanium (Ti). For example, the dielectric layer 243 may include $Mg_2SiO_4$, $MgAlO_4$, and $CaTiO_3$.

The number of dielectric layers 243 may be two or more. The patch antenna pattern 241 may be disposed between the plurality of dielectric layers 243. For example, the plurality of dielectric layers 243 may be adhered to each other through an adhesive material (e.g., an adhesive polymer).

The patch antenna pattern 241 and the feed via 242 may be implemented in the same way as the patch antenna pattern and the feed via shown in FIG. 6B, and the electrical connection structure 244 may be implemented in the same manner as the electrical connection structure shown in FIG. 1A. The feed via 242 may be fed from the feed via of the second substrate 200c, and may be electrically connected to the first and second FEICs 120a and 120b.

The number of chip antennas 240 may be four or more. As the number of chip antennas 240 increases, the gain and maximum output of the radio frequency module 300c according to an embodiment of the present disclosure may be increased, and the size of the radio frequency module 300c in the horizontal direction may be increased.

Since the gain and maximum output of the radio frequency module 300c may be increased due to the amplification of the first and second FEICs 120a and 120b, the number of the chip antenna 240, as compared to the gain and maximum output thereof and the size of the radio frequency module 300c may be reduced due to at least one of the first and second FEICs 120a and 120b.

At least two of the at least four chip antennas 240 may be electrically connected to the first FEIC 120a, and the remainder thereof may be electrically connected to the second FEIC 120b.

Accordingly, since a horizontal distance may be shorter in a feed path of the at least four chip antennas 230, an electrical path between the first and second FEICs 120a and 120b may be shorter, and energy loss of the feed path may be further reduced.

Figure 7A:
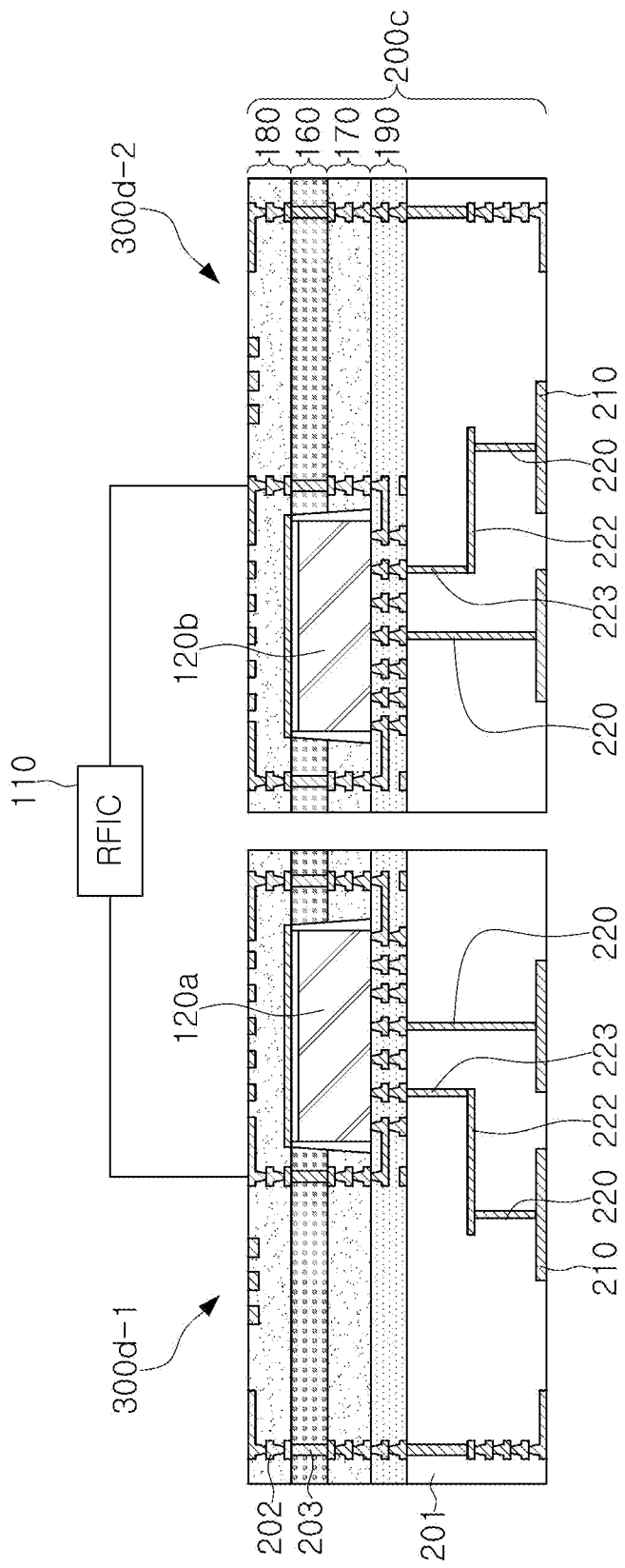
FIGS. 7A to 7C are side views illustrating a plurality of first substrates and a plurality of second substrates of the radio frequency module according to an embodiment of the present disclosure.
Figure 7B:
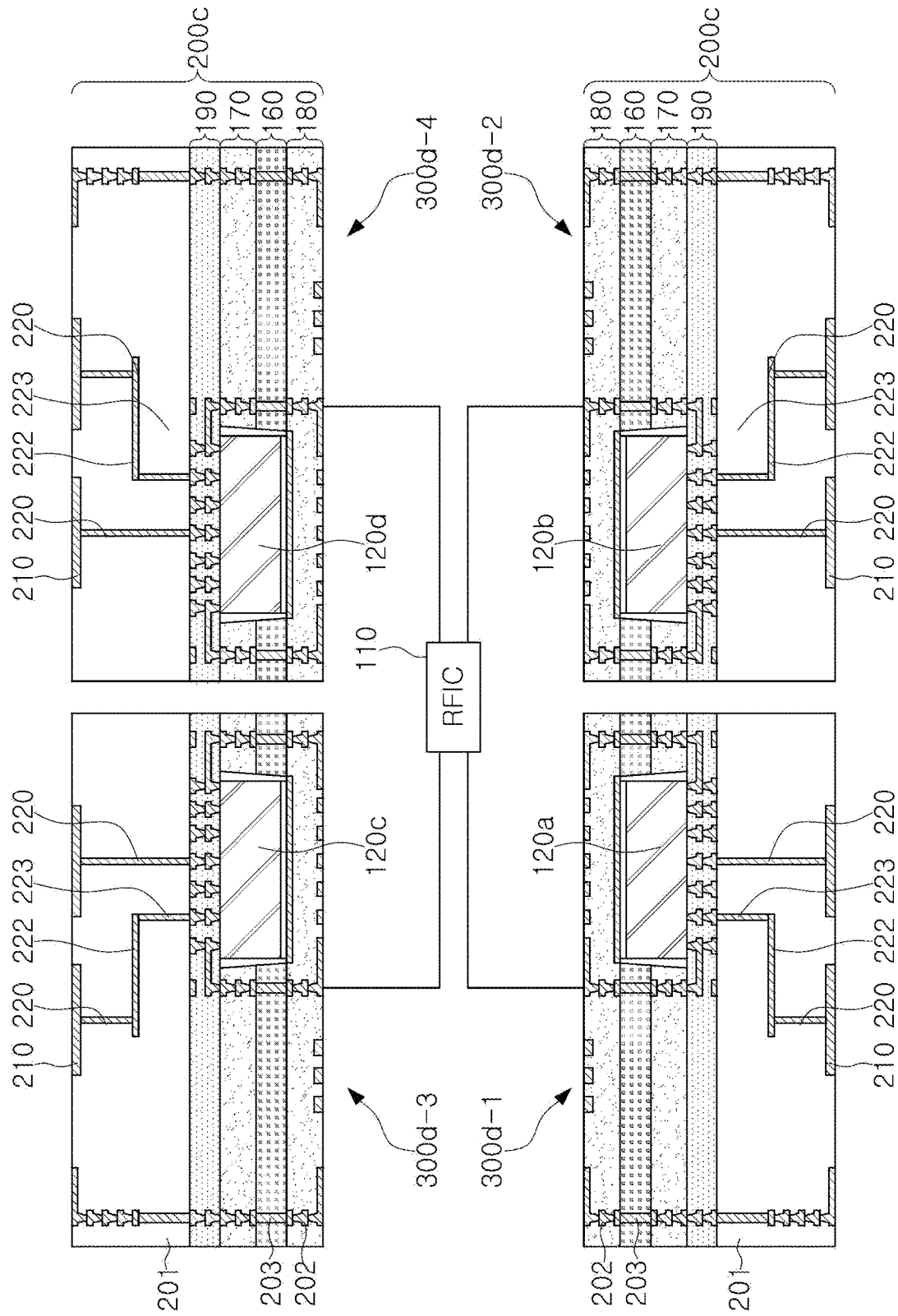
Figure 7C:
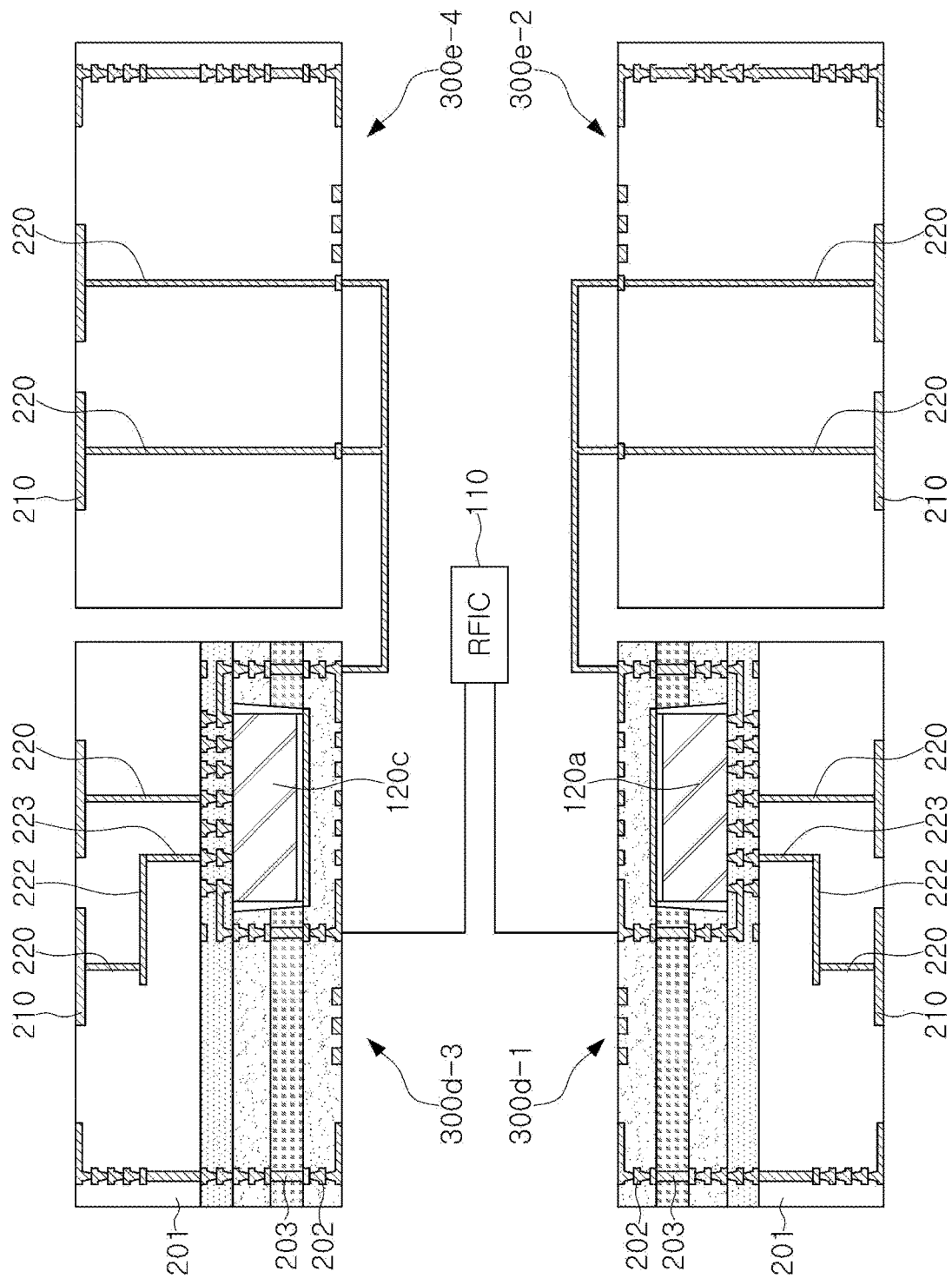

FIGS. 7A to 7C are side views illustrating a plurality of first substrates and a plurality of second substrates of a radio frequency module according to an embodiment of the present disclosure.

Referring to FIG. 7A, radio frequency modules 300d-1 and 300d-2 according to an embodiment of the present disclosure may be divided into two.

That is, a first substrate including a third connection member 190, a first connection member 170, a core member 160, and a second connection member 180 may be comprised of a plurality of first substrates spaced apart from each other. A second substrate 200c may be formed of a plurality of second substrates 200c spaced apart from each other.

Each of the plurality of second substrates 200c may provide a dispositional region of a patch antenna pattern 210 configured to transmit or receive a second RF signal and a dispositional region of a chip antenna configured to transmit or receive a second RF signal and having a higher dielectric constant than that of the second substrate 200c.

Accordingly, the dispositional position of the patch antenna pattern 210 or the chip antenna of the radio frequency modules 300d-1 and 300d-2 may be more freely designed, and a formation direction of radiation patterns for transmitting or receiving a second RF signal of the radio frequency modules 300d-1 and 300d-2 may be further varied.

The first and second FEICs 120a and 120b may be disposed in a corresponding first substrate among the plurality of first substrates, and may be electrically connected to a RFIC 110, respectively.

Accordingly, since a horizontal distance in the feed path of the at least four patch antenna patterns 210 may be shorter, an electrical length between the first and second FEICs 120a and 120b and the at least four patch antenna patterns 210 may be shorter, and energy loss of the feed path may be further reduced.

Referring to FIG. 7B, radio frequency modules 300d-1, 300d-2, 300d-3, and 300d-4 according to an embodiment of the present disclosure may be divided into four, and may further include third and fourth FEIC 120c and 120d. The first, second, third, and fourth FEICs 120a, 120b, 120c, and 120d may be disposed in a corresponding first substrate, among the four first substrates, and may be electrically connected to a RFIC 110, respectively.

Referring to FIG. 7C, the radio frequency modules 300d-1, 300e-2, 300d-3, and 300e-4 according to an embodiment of the present disclosure may be divided into four, and may have a structure in which third and fourth FEICs are omitted. That is, each of the first and third FEICs 120a and 120c may be electrically connected to a plurality of patch antenna patterns 210 or chip antennas disposed on the plurality of second substrates 200c.

Figure 8A:
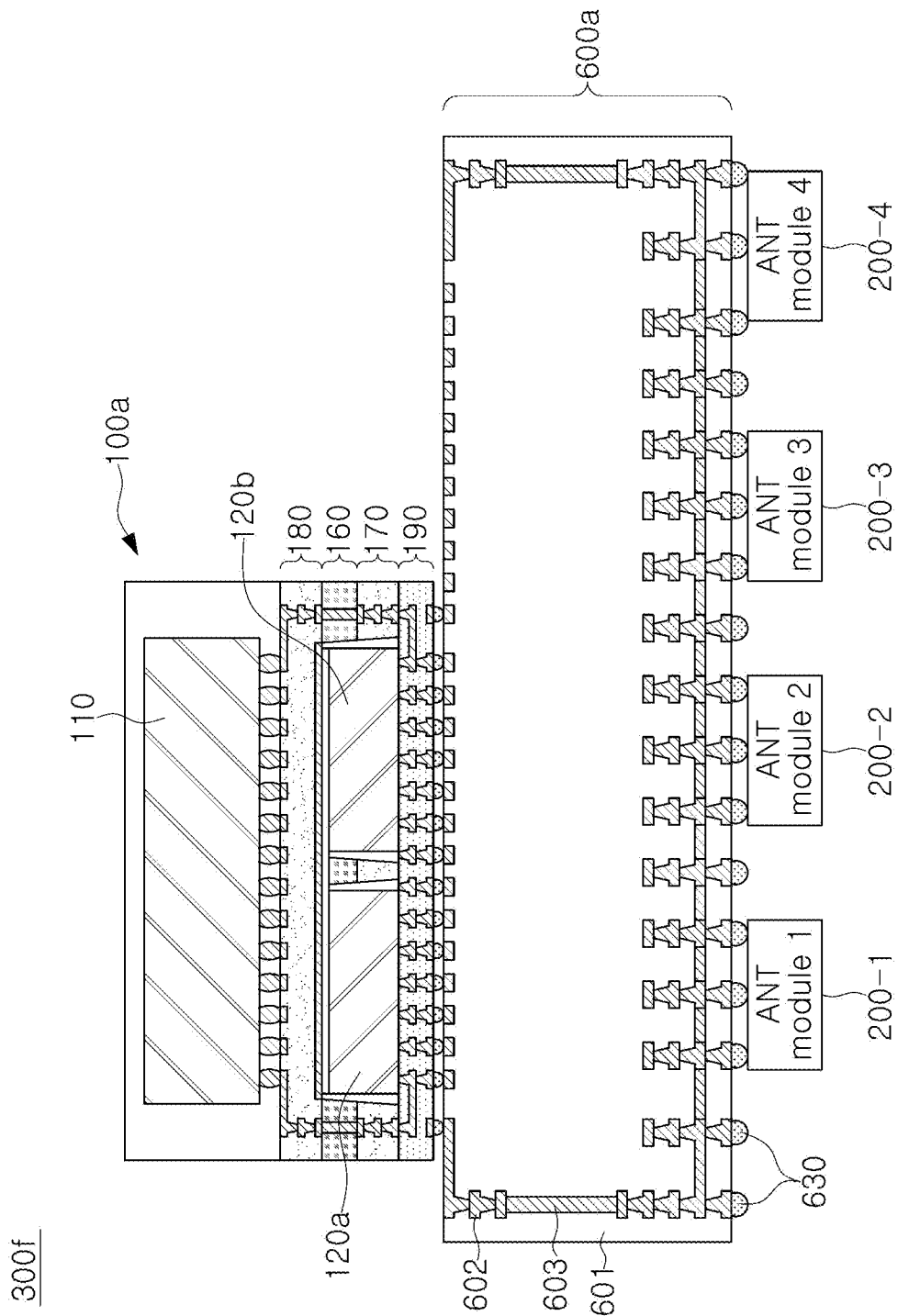
FIGS. 8A and 8B are side views illustrating a radio frequency module and a plurality of antenna modules according to an embodiment of the present disclosure.
Figure 8B:
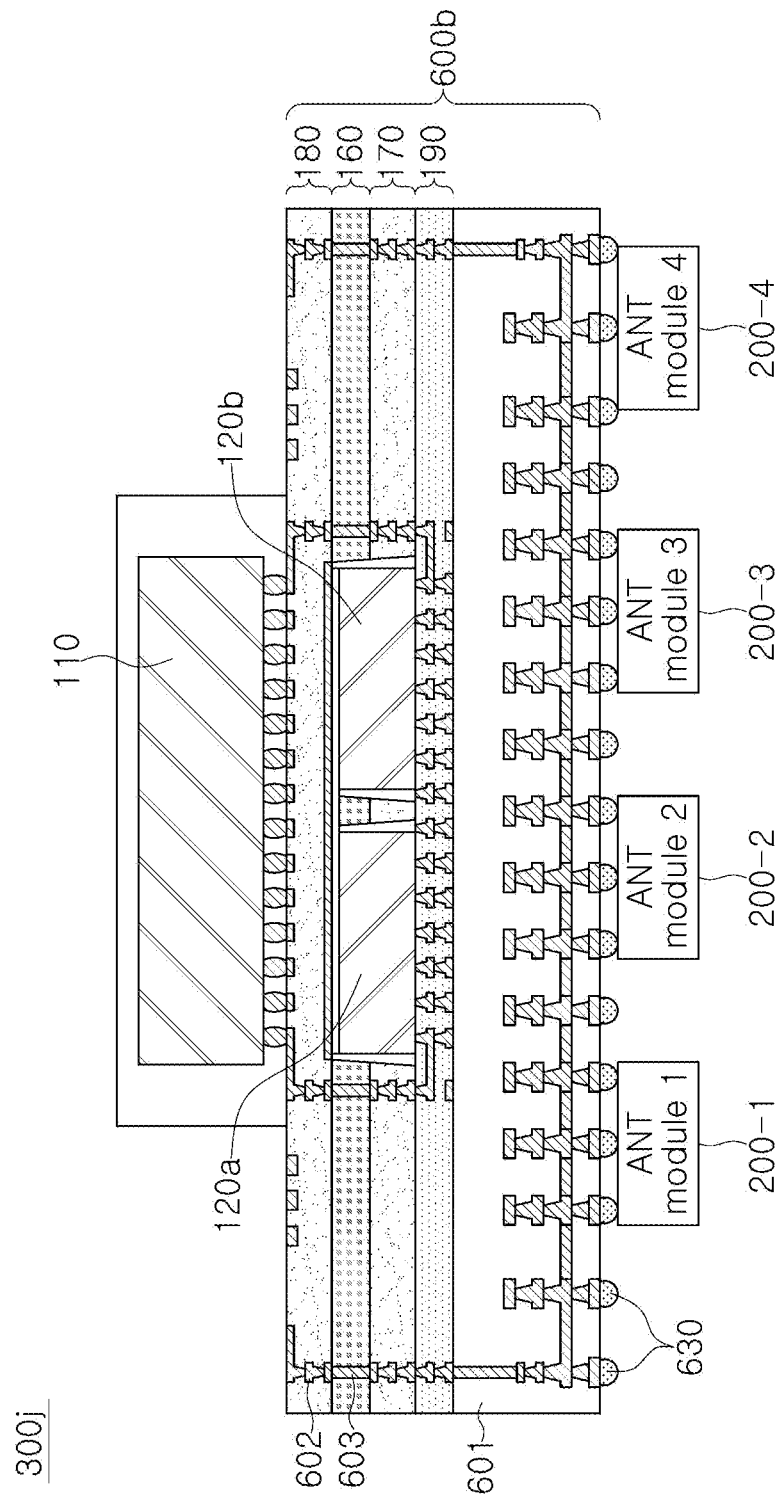

FIGS. 8A and 8B are side views illustrating a radio frequency module and a plurality of antenna modules according to an embodiment of the present disclosure.

Referring to FIG. 8A, a radio frequency module 300f according to an embodiment of the present disclosure may include a chip radio frequency package 100a, a plurality of antenna modules 200-1, 200-2, 200-3, and 200-4, and a base substrate 600a.

Depending on the design, the RFIC 110 may be omitted from the chip radio frequency package 100a.

The plurality of antenna modules 200-1, 200-2, 200-3, and 200-4 may be disposed on the base substrate 600a and spaced apart from each other, and electrically connected to the first and second FEICs 120a and 120b, and may be configured to transmit or receive the second RF signal, respectively.

For example, the plurality of antenna modules 200-1, 200-2, 200-3, and 200-4 may include a second substrate illustrated in FIGS. 5B, 6A, 6B, 6C, 7A, 7B, and 7C, and may further include a patch antenna pattern and/or a chip antenna.

For example, the number of the plurality of antenna modules 200-1, 200-2, 200-3, and 200-4 may be three or more, and the three or more antenna modules may be disposed to form a radiation pattern in X-axis, Y-axis, and Z-axis directions, respectively.

A base substrate 600a may provide a dispositional region of the chip radio frequency package 100a. That is, the base substrate 600a may provide a dispositional region of the first substrate including the third connection member 190, the first connection member 170, the core member 160, and the second connection member 180.

The dispositional position of the plurality of antenna modules 200-1, 200-2, 200-3, and 200-4 on the base substrate 600a can be designed more freely, and a formation direction of radiation patterns for transmitting and receiving the second RF signal of the plurality of antenna modules 200-1, 200-2, 200-3, and 200-4 may be further varied.

The first and second FEICs 120a and 120b may be electrically connected to a corresponding antenna module among the plurality of antenna modules 200-1, 200-2, 200-3, and 200-4. For example, the first FEIC 120a may be electrically connected to the plurality of antenna modules 200-1 and 200-2, and the second FEIC 120b may be electrically connected to the plurality of antenna modules 200-3 and 200-4.

Accordingly, since a horizontal distance may be shorter in the feed paths of the plurality of antenna modules 200-1, 200-2, 200-3, and 200-4, an electrical length between the first and second FEICs 120a and 120b and a plurality of antenna modules 200-1, 200-2, 200-3, and 200-4 may be shorter, and energy loss of the feed path can be further reduced.

Referring to FIG. 8B, a radio frequency module 300j according to an embodiment of the present disclosure may have a structure in which a chip radio frequency package is merged (built-in) with a base substrate 600b. A RFIC 110 may be disposed on an upper surface of the base substrate 600b.

A third connection member 190, a first connection member 170, a core member 160, and a second connection member 180 may be sequentially disposed on the base substrate 600b. For example, the chip radio frequency and one surface of the base substrate 600b may be coupled to each other through an adhesive material.

The first and second FEICs 120a and 120b may be embedded in a coupling structure between the chip radio frequency package and the base substrate 600b. Accordingly, an electrical length between the first and second FEICs 120a and 120b may be shorter, and energy loss of the feed path may be further reduced.

Figure 9:
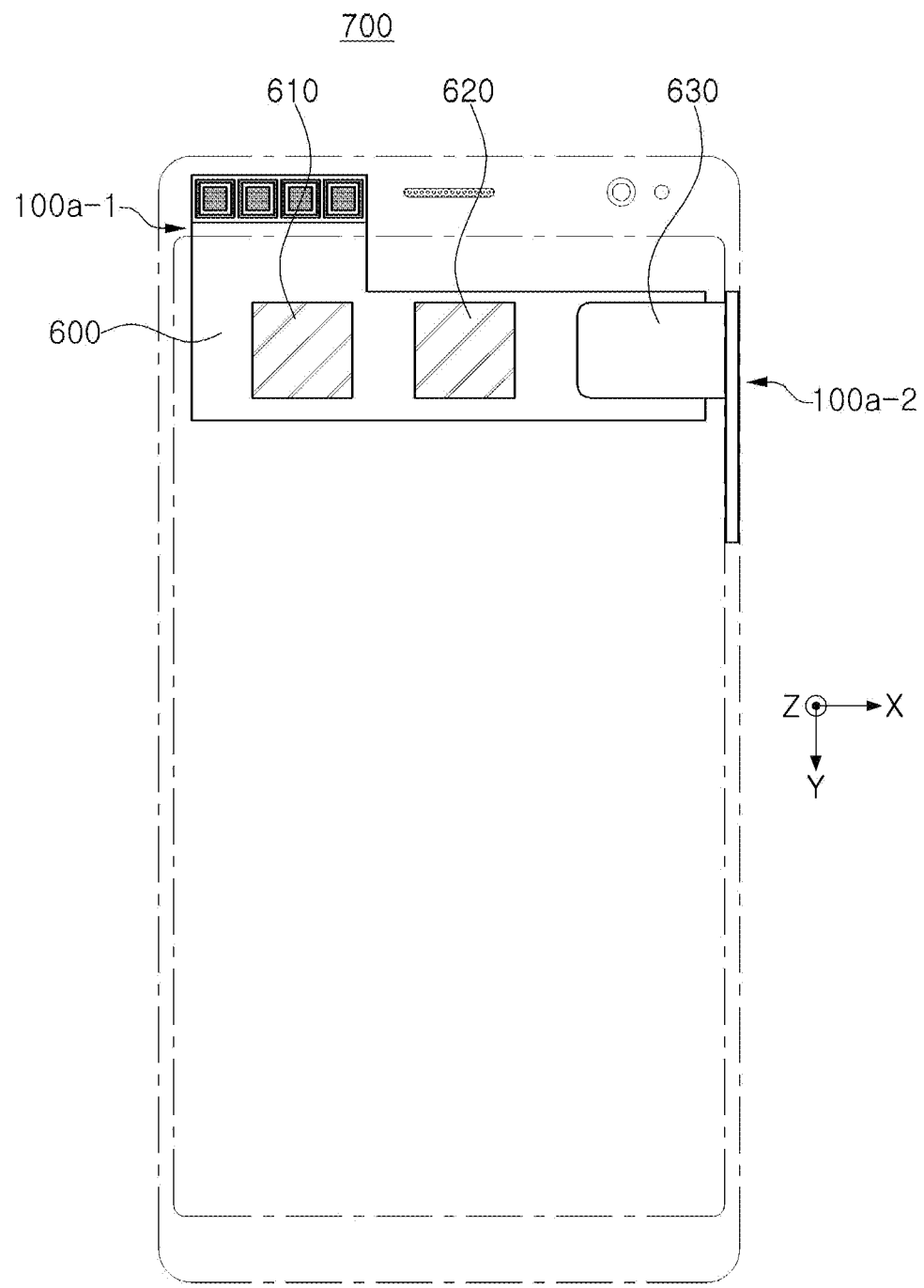
FIG. 9 is a plan view illustrating an example disposition of a radio frequency module in an electronic device according to one or more embodiments.

FIG. 9 is a plan view illustrating an example disposition of a radio frequency module in an electronic device, in accordance with one or more embodiments.

Referring to FIG. 9, example radio frequency modules 100a-1 and 100a-2 may be disposed adjacent to a plurality of different edges of an electronic device 700, respectively.

In a non-limiting example, the electronic device 700 may be a smartphone, a personal digital assistant, a digital video camera, a digital still camera, a network system, a computer, a monitor, a tablet PC, a laptop computer, a netbook computer, a television set, a video game, a smartwatch, an automobile, or may be an apparatus provided in, autonomous vehicles, robotics, smartphones, tablet devices, augmented reality (AR) devices, Internet of Things (IoT) devices, and similar devices, but the present disclosure is not limited thereto, and may correspond to various other types of devices.

The electronic device 700 may include a base substrate 600, and the base substrate 600 may further include a communication modem 610 and a baseband IC 620.

The communication modem 610 may include at least a portion of: a memory chip such as at least one of a volatile memory or a nonvolatile memory. The nonvolatile memory may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. The volatile memory may include dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), and the like. Furthermore, the storage device 820 may include at least one of hard disk drives (HDDs), solid state drive (SSDs), compact flash (CF) cards, secure digital (SD) cards, micro secure digital (Micro-SD) cards, mini secure digital (Mini-SD) cards, extreme digital (xD) cards, or Memory Sticks.

The communication modem 610 may include an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, to perform digital signal processing.

The baseband IC 620 may perform analog-to-digital conversion, amplification, filtering, and frequency conversion on the analog signal to generate a base signal. The base signal input/output from the baseband IC 620 may be transferred to radio frequency modules 100*a*-1 and 100*a*-2 through the coaxial cable, and the coaxial cable may be electrically connected to an electrical connection structure of the radio frequency modules 100*a*-1 and 100*a*-2.

For example, a frequency of the base signal may be within a baseband, and may be a frequency (e.g., several GHz) corresponding to an intermediate frequency (IF). A frequency of the RF signal (e.g., 28 GHz, 39 GHz) may be higher than the IF, and may correspond to a millimeter wave (mmWave).

The wiring layers, vias, and patterns, disclosed herein may be formed of metal materials (e.g., a conductive material such as copper (Cu), aluminum (Al), silver (Ag), tin (Sn), gold (Au), nickel (Ni), lead (Pb), titanium (Ti), alloys thereof, or the like), and may be formed according to plating methods such as chemical vapor deposition (CVD), physical vapor deposition (PVD), sputtering, subtractive, additive, a semi-additive process (SAP), a modified semi-additive process (MSAP), or the like, but is not limited thereto.

The insulating layer disclosed herein may be implemented by a prepreg, FR4, a thermosetting resin such as epoxy resin, a thermoplastic resin, or a resin formed by impregnating these resins in a core material such as a glass fiber, a glass cloth, a glass fabric, or the like, together with an inorganic filler, Ajinomoto Build-up Film (ABF) resin, bismaleimide triazine (BT) resin, a photoimageable dielectric (PID) resin, a copper clad laminate (CCL), a ceramic-based insulating material, or the like.

The RF signals developed herein may have a format according to W-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G and any other wireless and wired protocols specified thereafter, but is not limited thereto. In addition, the frequency of the RF signal (e.g., 24 GHz, 28 GHz, 36 GHz, 39 GHz, 60 GHz) is greater than the frequency of the IF signal (e.g., 2 GHz, 5 GHz, 10 GHz, etc.).

As set forth in the examples, a chip radio frequency package and a radio frequency module may have an improved processing performance for a radio frequency signal (e.g., power efficiency, amplification efficiency, frequency conversion efficiency, heat dissipation efficiency, noise robustness, or the like), or a reduced size.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency module, comprising:
   a first substrate including first and second connection members, and including a core member disposed between the first and second connection members and having a first cavity;
   a radio frequency IC (RFIC) disposed on an upper surface of the first substrate;
   a first front end IC (FEIC) disposed in the first cavity; and
   a second substrate providing a dispositional region of the first substrate,
   wherein the core member comprises a core insulating layer, and a core via disposed to penetrate through the core insulating layer,
   the first connection member has a first stacked structure in which at least one first insulating layer and at least one first wiring layer are alternately stacked, is electrically connected to the core via, and disposed on a lower surface of the core member,
   the second connection member has a second stacked structure in which at least one second insulating layer and at least one second wiring layer are alternately stacked, is electrically connected to the core via, and disposed on an upper surface of the core member,
   the RFIC inputs or outputs a base signal and a first radio frequency (RF) signal having a frequency, higher than the frequency of the base signal, through the at least one second wiring layer, and
   the first RFIC inputs or outputs the first RF signal and a second RF signal having power, different from that of the first RF signal.

2. The radio frequency module of claim 1, further comprising an electrical connection structure electrically connected between the second substrate and the first substrate,
   wherein the first substrate is disposed on an upper surface of the second substrate.

3. The radio frequency module of claim 1, wherein the second substrate comprises a patch antenna pattern configured to transmit or receive the second RF signal, and
   a feed via configured to be fed to the patch antenna pattern.

4. The radio frequency module of claim 1, further comprising a chip antenna disposed on the second substrate and configured to transmit or receive the second RF signal, and having a higher dielectric constant than the dielectric constant of the second substrate,
   wherein the second substrate comprises a feed via configured to be fed to the chip antenna.

5. The radio frequency module of claim 1, further comprising a second FEIC disposed in a second cavity of the core member.

6. The radio frequency module of claim 5, wherein the second substrate comprises at least four patch antenna patterns configured to transmit or receive the second RF signal; and
   at least four feed vias configured to be fed to a corresponding patch antenna pattern among the at least four patch antenna patterns, respectively,
   wherein at least two of the at least four feed vias are electrically connected to the first FEIC, and a remainder thereof are electrically connected to the seconds FEIC.

7. The radio frequency module of claim 5, further comprising at least four chip antennas disposed on the second substrate, and configured to transmit or receive the second RF signal and having a higher dielectric constant than the dielectric constant of the second substrate; and at least four feed vias configured to be fed to a corresponding chip antenna among the at least four chip antennas, respectively, wherein at least two of the at least four feed vias are electrically connected to the first FEIC, and a remainder thereof are electrically connected to the second FEIC.

8. The radio frequency module of claim 1, further comprising an encapsulant sealing at least a portion of the RFIC on the upper surface of the first substrate.

9. The radio frequency module of claim 1, wherein the lower surface of the first substrate is smaller than the upper surface of the second substrate.

10. The radio frequency module of claim 1, wherein the first substrate is comprised of a plurality of first substrates, spaced apart from each other, the first FEIC is disposed on one of the plurality of first substrates, the radio frequency module further comprises a second FEIC disposed on the other one of the plurality of first substrates, the second substrate is comprised of a plurality of second substrates, spaced apart from each other, and each of the plurality of second substrates provides at least one of a first dispositional region of the patch antenna pattern configured to transmit or receive the second RF signal and a second dispositional region of the chip antenna configured to transmit or receive the second RF signal and having a higher dielectric constant than the dielectric constant of the second substrate.

11. The radio frequency module of claim 10, wherein the plurality of second substrates are comprised of at least three second substrates, spaced apart from each other, and at least one of the at least three second substrates is spaced apart from the plurality of first substrates.

12. A radio frequency module, comprising:

a first substrate including first and second connection members, and including a core member disposed between the first and second connection members and having a first cavity;

a first front end IC (FEIC) disposed in the first cavity;

a radio frequency IC (RFIC) electrically connected to the first FEIC;

a base substrate providing a dispositional region of the first substrate; and a plurality of antenna modules disposed on the base substrate, spaced apart from each other and electrically connected to the first FEIC, and configured to transmit or receive a second radio frequency (RF) signal, respectively, wherein the core member comprises a core insulating layer and a core via disposed to penetrate through the core insulating layer, the first connection member has a first stacked structure in which at least one first insulating layer and at least one first wiring layer are alternately stacked, is electrically connected to the core via, and disposed on a lower surface of the core member, the second connection member has a second stacked structure in which at least one second insulating layer and at least one second wiring layer are alternately stacked, is electrically connected to the core via, and disposed on an upper surface of the core member, the RFIC inputs or outputs a base signal and a first RF signal having a higher frequency than the frequency of the base signal, and the first FEIC inputs or outputs the first RF signal and the second RF signal having power, different from the power of the first RF signal.

13. The chip frequency module of claim 12, wherein at least one of the plurality of antenna modules comprises a second substrate including a plurality of feed vias electrically connected to the base substrate, and a plurality of patch antenna patterns fed from a corresponding feed via of the plurality of feed vias.

14. The chip frequency module of claim 12, wherein at least one of the plurality of antenna modules comprises a second substrate including a plurality of feed vias electrically connected to the base substrate, and a plurality of chip antennas disposed on the second substrate, and configured to transmit or receive the second RF signal and having a higher dielectric constant than the dielectric constant of the second substrate.

15. The chip frequency module of claim 12, further comprising a second FEIC disposed in a second cavity of the core member, wherein the plurality of antenna modules comprise at least three antenna modules, and at least one of the first and second FEICs is electrically connected to at least two of the at least three antenna modules.

16. The radio frequency module of claim 12, wherein the plurality of antenna modules are disposed to transmit or receive the second RF signal in different directions from each other.

17. The radio frequency module of claim 16, further comprising a communication modem disposed on the base substrate, wherein the base substrate provides a dispositional region of the RFIC.

* * * * *